(12) United States Patent
Scheirer et al.

(10) Patent No.: US 6,363,175 B1
(45) Date of Patent: Mar. 26, 2002

(54) SPECTRAL ENCODING OF INFORMATION

(75) Inventors: Erik K. Scheirer, Silver Spring, MD (US); Donald A. O'Neil, San Jose, CA (US)

(73) Assignee: Sonyx, Inc., Silver Spring, MD (US)

( * ) Notice: Subject to any disclaimer, the term of this patent is extended or adjusted under 35 U.S.C. 154(b) by 0 days.

(21) Appl. No.: 09/053,641

(22) Filed: Apr. 2, 1998

Related U.S. Application Data

(60) Provisional application No. 60/041,795, filed on Apr. 2, 1997.

(51) Int. Cl.[7] .................................................. G06K 9/36
(52) U.S. Cl. ....................................... 382/232; 370/480
(58) Field of Search ............................... 348/393, 397, 348/398; 382/191, 232; 370/343, 465, 468, 477, 480, 481, 482, 483, 487, 493, 497; 375/503

(56) References Cited

U.S. PATENT DOCUMENTS

| | | | |
|---|---|---|---|
| 5,247,347 A | 9/1993 | Litteral et al. ................. 358/85 |
| 5,253,271 A * | 10/1993 | Montgomery ................. 375/59 |
| 5,351,016 A * | 9/1994 | Dent ........................... 332/103 |
| 5,383,225 A | 1/1995 | Aguirre et al. .............. 375/106 |
| 5,396,489 A | 3/1995 | Harrison ....................... 370/50 |
| 5,416,618 A * | 5/1995 | Juday ............................ 359/53 |
| 5,422,913 A | 6/1995 | Wilkinson ................... 375/347 |
| 5,426,665 A | 6/1995 | Cleverly et al. ............. 375/200 |
| 5,446,462 A | 8/1995 | Cleveland ..................... 342/45 |
| 5,450,456 A | 9/1995 | Mueller ....................... 375/224 |
| 5,457,685 A | 10/1995 | Champion .................... 370/62 |
| 5,457,690 A | 10/1995 | Joffe et al. ................ 370/105.1 |
| 5,465,287 A | 11/1995 | Egozi ............................ 379/5 |
| 5,477,465 A | 12/1995 | Zheng ......................... 364/485 |
| 5,541,955 A * | 7/1996 | Jacobsmeyer ............... 375/222 |
| 5,600,672 A * | 2/1997 | Oshima et al. ............. 375/219 |

* cited by examiner

Primary Examiner—Andrew W. Johns
Assistant Examiner—Seyed Azarian
(74) Attorney, Agent, or Firm—Pillsbury Winthrop LLP

(57) ABSTRACT

A data encoding scheme maps a set of data to a number of spectral components, each component having an amplitude, a phase and a unique frequency. From these mapped tones, an analog baseband signal can be formed, which, when implemented in a data transmission scheme, can realize much higher throughput per available bandwidth than conventional techniques such as those employing binary baseband signals. The encoding scheme can also be implemented in data compression schemes and can realize lossless compression ratios exponentially superior to conventional compression schemes.

20 Claims, 28 Drawing Sheets

A more detailed view of an SEI system. Encoded spectra are emitted over time, flowing forward in this direction →

*The Inverse Discrete Fourier Transform*

*The Discrete Fourier Transform*

The Fourierlet Shape Shifter

*The Fourierlet Shape Shifter in System Context.*

SPECTRAL ENCODING OF INFORMATION

This application claims the benefit of provisional application No. 60/041,795, filed Apr. 2, 1997.

BACKGROUND OF THE INVENTION

Conventional methods for compressing and encoding data, and digital data in particular, continually strive for higher throughput rates. In transmission schemes, for example, digital data is typically converted into a binary baseband signal wherein the data to be transmitted can be viewed as a stream of 0's and 1's, as shown in FIG. 1.

Computer modems, for example, employ modulation techniques such as Phase Shift Keying and Quadrature Amplitude Modulation, whereby a pattern of bits (i.e., a binary baseband signal such as that shown in FIG. 1) is used to modulate a carrier signal. Where a tribit PSK coding is employed (for example, that recommended by CCITT Rec. V.27), three bits at a time are used to phase shift the transmitted signal by up to eight phases, permitting up to three times the bandwidth of the telephone carrier to be transmitted, and achieving 9600 bits/sec throughput. FIG. 2 illustrates PSK modulation in a conventional computer modem; however, for convenience of illustration, only a dual phase technique (unibit coding) is shown.

As the ability of computers to process information continues to advance, however, so does the need for higher transmission rates of data. Full-motion video, hypertext, and sound wave synthesis capabilities are becoming commonplace in even standard-grade computer systems, and these applications require huge quantities of data at high throughput rates. Consequently, transmission of these amounts of data at useful speeds is becoming a serious bottleneck to the development and proliferation of this technology.

Transmission of data across telephone lines is limited most notably by the narrow bandwidth available with telephone equipment. The useful range is generally limited to between 300 Hz and 3000 Hz, yielding a bandwidth of less than 3 kHz. Conventional 9600 baud modems using PSK techniques on binary baseband signals swallow virtually all of this usable bandwidth, constraining the ability to improve data throughput.

It should be noted that other means for transmitting digital data also generally rely on a binary baseband signal and thus suffer from the same bandwidth constraints, albeit to different degrees, as telephone transmissions. The transmission of data over a telephone system is given merely as one example where the conventional technology suffers from the problems described above. Other areas where similar constraints apply include local and wide area networks, satellite communications, mass storage devices, radio and cellular communications, digital audio and video recordings, and so on.

SUMMARY OF THE INVENTION

Accordingly, it is an object of the invention to provide a data encoding system which makes use of available bandwidth more efficiently.

It is another object of the invention to provide a data encoding system which can provide higher throughput rates when implemented in a data transmission scheme.

It is another object of the invention to provide a data encoding system which can provide higher throughput rates when implemented in a data compression scheme.

To achieve these and other objects, a data encoding scheme of the present invention maps a set of data to a number of spectral components, each component having an amplitude, a phase and a unique frequency. From these mapped sinusoids, a representation of an analog baseband signal can be formed. From this representation, a signal, either analog or digital, can be formed. When implemented in a data transmission scheme, the system can realize much higher throughput per available bandwidth than conventional techniques such as those employing binary baseband signals. Further, when implemented in a data compression scheme, the data encoding method can yield exponentially greater compression ratios without loss.

According to the data encoding system of the present invention, data to be transmitted or compressed is encoded such that it can be converted into an analog baseband signal, rather than a binary baseband signal, as is commonly done in the conventional arts. Although the encoding technique of the present invention should not be construed as limited to the particular applications of data transmission and compression, these implementations are considered sufficiently illustrative of the concepts of the invention, as well as its superiority over conventional techniques. Those skilled in the art, however, will readily appreciate from this description that other applications in keeping with the described concepts of the disclosed data encoding technique are possible with modifications necessary for those applications.

BRIEF DESCRIPTION OF THE DRAWINGS

Those skilled in the art will be able to understand the details of the invention by reference to the following detailed description, taken in conjunction with the attached drawing figures, in which.

DETAILED DESCRIPTION OF THE PREFERRED EMBODIMENTS

I. General Application

What will be described hereinafter is a method for encoding discrete information within a signal complex having a spectrum of frequencies by manipulating the characteristics of each spectral component within that spectrum in a way that is fundamentally different from currently used methods.

Figure 1:
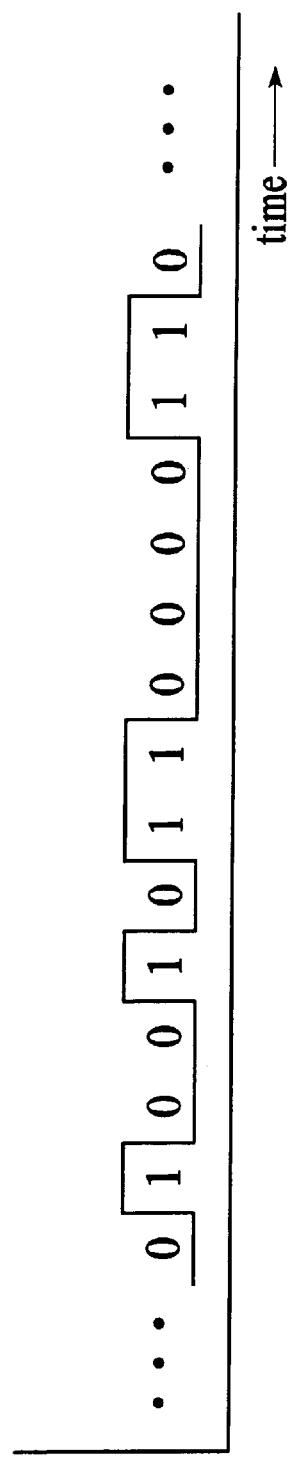
FIG. 1 illustrates a binary baseband signal commonly used in a conventional data transmission application.
Figure 2:
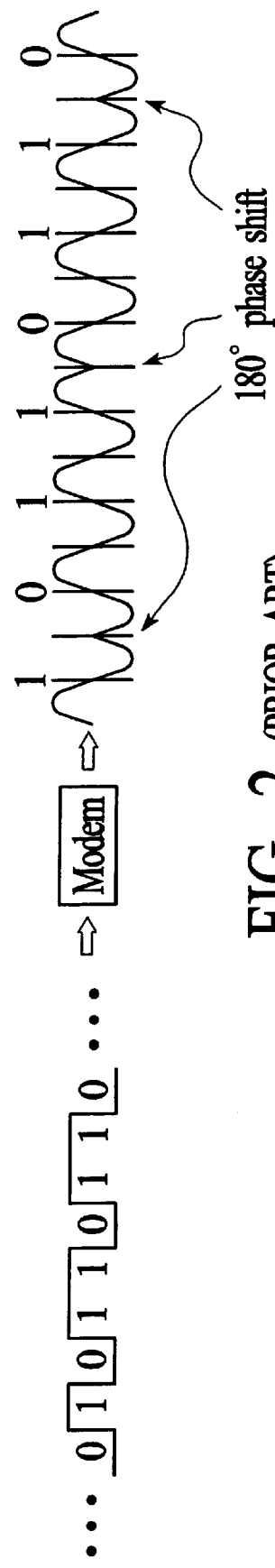
FIG. 2 illustrates a conventional modem implementing phase shift keying of a binary baseband signal.
Figure 3:
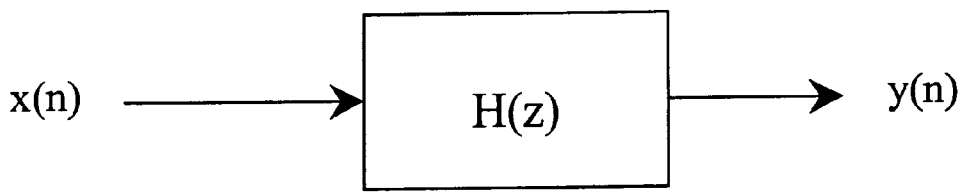
FIG. 3 illustrates the transformation of an input data stream to an output data form.

Consider a system of encoding data within a spectrum of frequencies of a digital or analog signal complex. The system, as a whole, could be described generally by the transfer function H(z):

$$H(z) = s/d$$

where d is the data input (providing the impulse to the transfer function), and s is the resulting encoded spectrum or, equivalently as in FIG. 3, where x(n) is the impulse to the transfer function H(z) and y(n) is the resulting encoded spectrum.

Figure 4:
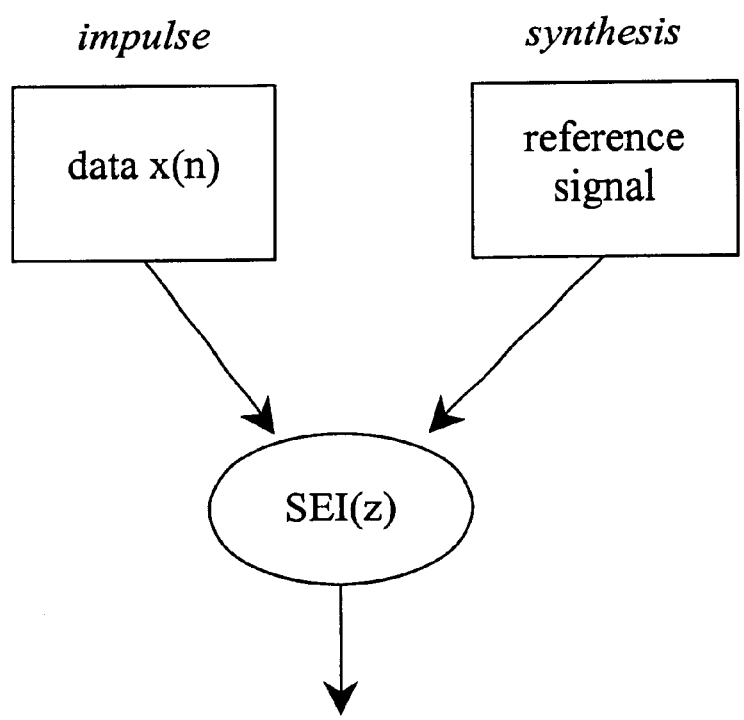
FIG. 4 illustrates a block diagram of an encoding scheme according to a method of the present invention.
Figure 5:
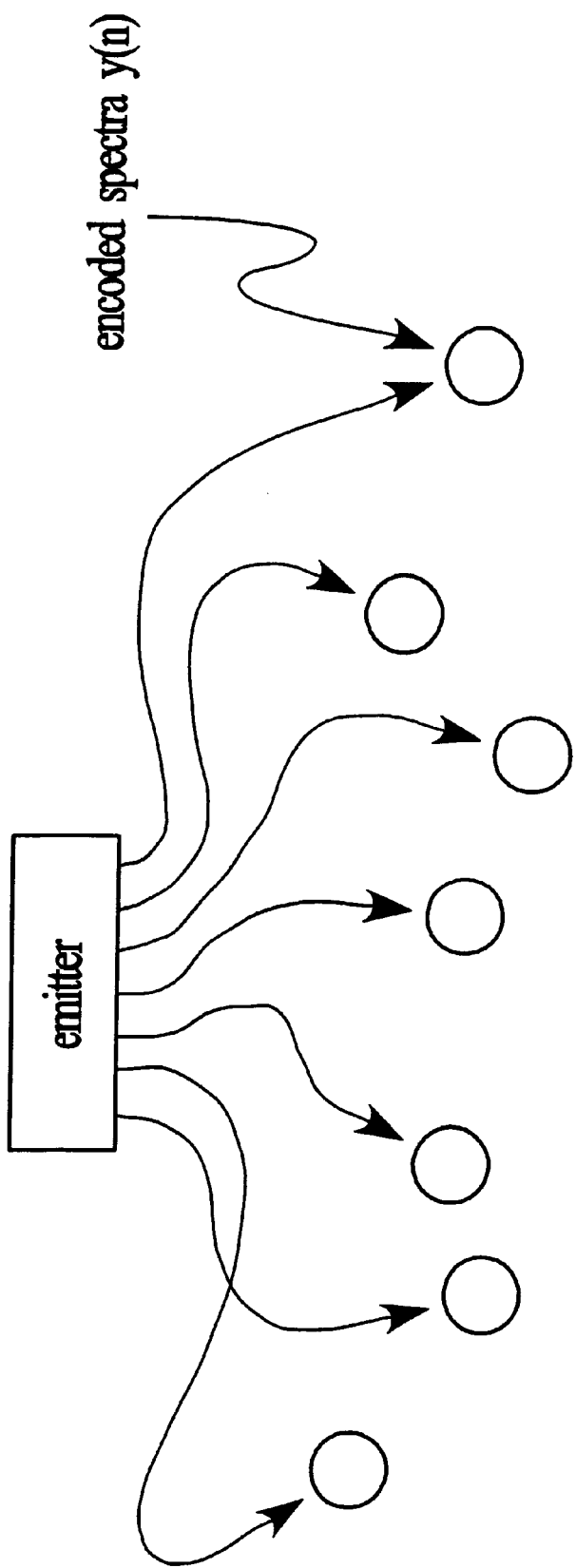
FIG. 5 illustrates a conceptual diagram of an encoding system utilizing aspects of the present invention.
Figure 6:
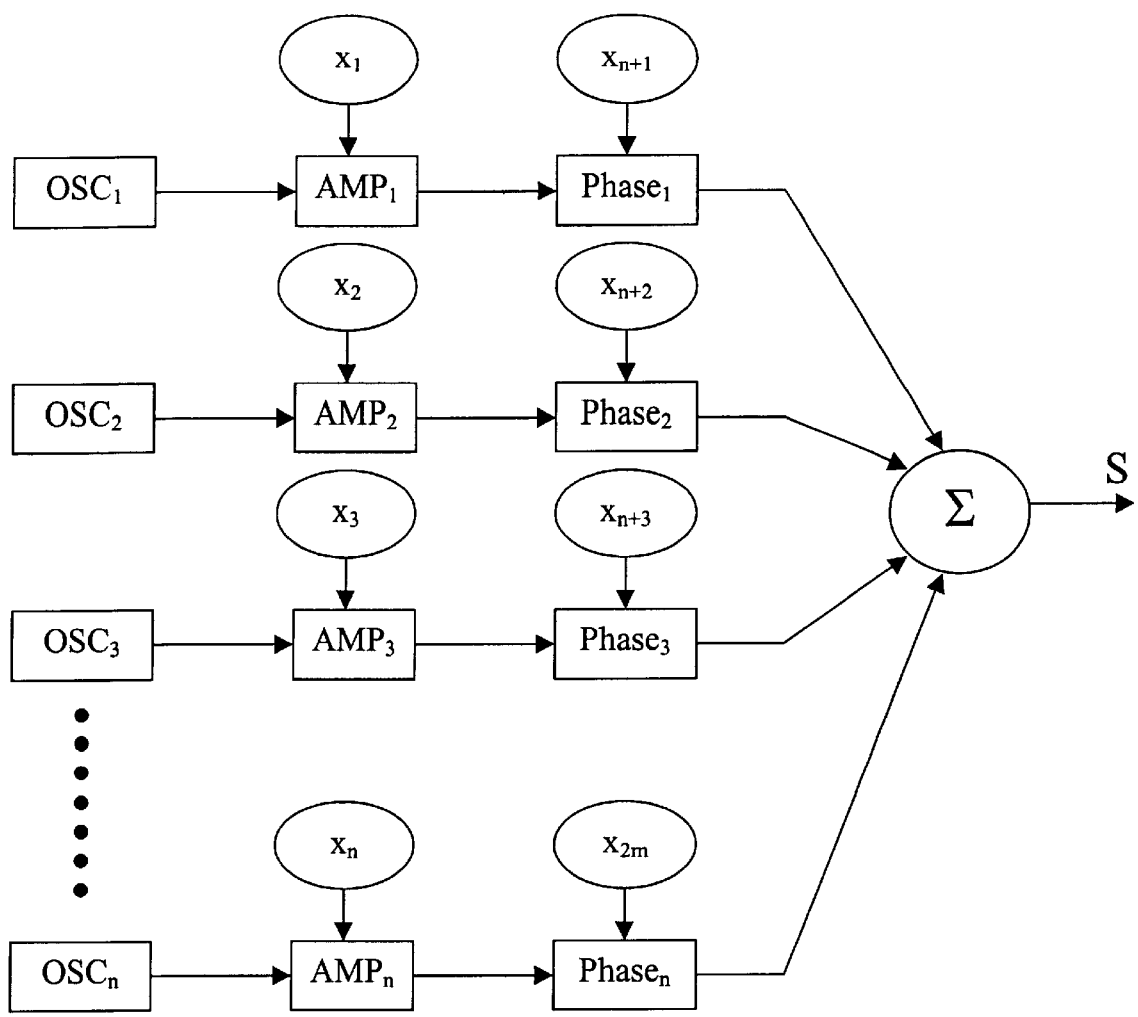
FIG. 6 illustrates an encoding system in accordance with the principles of the invention.

Or, using a little more detail to show some of the time aspects of the system, and using SEI(z) to represent H(z), the system can be represented as shown in FIGS. 4 and 5. The "emitter" here refers to the Fourierlet Shape Shifter described in greater detail later; suffice it to say that framed, encoded spectra are periodically emitted from the system as output (Here, the "emitter" is something called the Fourierlet Shape Shifter, and will be described in greater detail in the following text.)

Now consider that, in a continuous time system, each spectral component within a signal complex is represented by a sinusoid. The relevant attributes of each sinusoid $S_i$ can be summed up as having three dimensions, identifiable at deterministic intervals of time:

(1) amplitude ($A_i$)
(2) phase ($\phi_i$)
(3) frequency ($f_i$) such that $$S_i = A_i \sin(2\pi f_i t + \phi_i)$$

By encoding data in a way that is retrievable via instantaneous measurements of these three attributes, currently unused aspects of analog signals can be exploited to represent discrete values, thus yielding a system whereby discrete values are encoded in each component of a spectrum of frequencies. This vastly improves throughput over existing methods because the data is stacked in several ways, using frequency, phase, and amplitude of a sine wave.

Stated another way, the method deals with representing discrete values at identifiable places within the dimensions of a given sine wave. By viewing a deterministic signal from the frequency domain point of view, the dimensions can be manipulated in a way that allows directly encoding the data to be represented in terms of amplitude (energy), phase, and implicitly, frequency. In particular, deterministic values of the local amplitude and phase of a particular sinusoid oscillating at a frequency within the bounds of some determined frequency range are considered as part of a signal, and as many of these frequencies as possible are used at the same time. The breadth of a given spectrum defines the complexity of the schema. Any spectrum can be used, even if it contains only one frequency.

Two primary concepts of this technique are:
 (1) the fact that information can be encoded via localized spectral characterization,
 (2) the representation of that spectrum can be changed (reduced or enlarged, i.e., compressed or expanded) to suit a particular need.

Of primary importance are the concepts of manipulation of localized spectral characteristics, and second, manipulating their representation. By combining these two notions, a new information encoding technique can be employed that is also usable for compression of information without loss, as well as for optimized transmission schemes. This is fundamentally different from other new technologies in that of foremost concern is the representation of information via localized spectral characterization, whereas the other technologies are concerned with utilizing a plurality of frequencies only, not how intelligence can be encoded within a spectrum.

It should be noted that the encoded analog baseband signal can be stationary or non-stationary (where the spectrum is not set). The means by which a signal's spectral information is localized or measured is incidental. One or many sinusoids are combined to form the spectrum, content and shape of the signal.

Moreover, the encoding and decoding of discrete values within the context of the sine wave dimensions is not limited to being viewed from the frequency domain, but approaching it from such a point of view greatly simplifies the understanding of and actual implementation of this method. This technique is referred to generally as SEI, sonYx Encoding of Information the basic quanta of which can be represented by the term spectral packets. A single spectral packet can be seen as being made up of one or many sinelets. The period of any specific packet is one complete 360 degree cycle of the lowest frequency component manipulated in that given spectrum.

II. Illustrative Example

The encoding scheme of the present invention will now be described in terms of one possible implementation that is illustrated in FIGS. 6–9.

Figure 8:
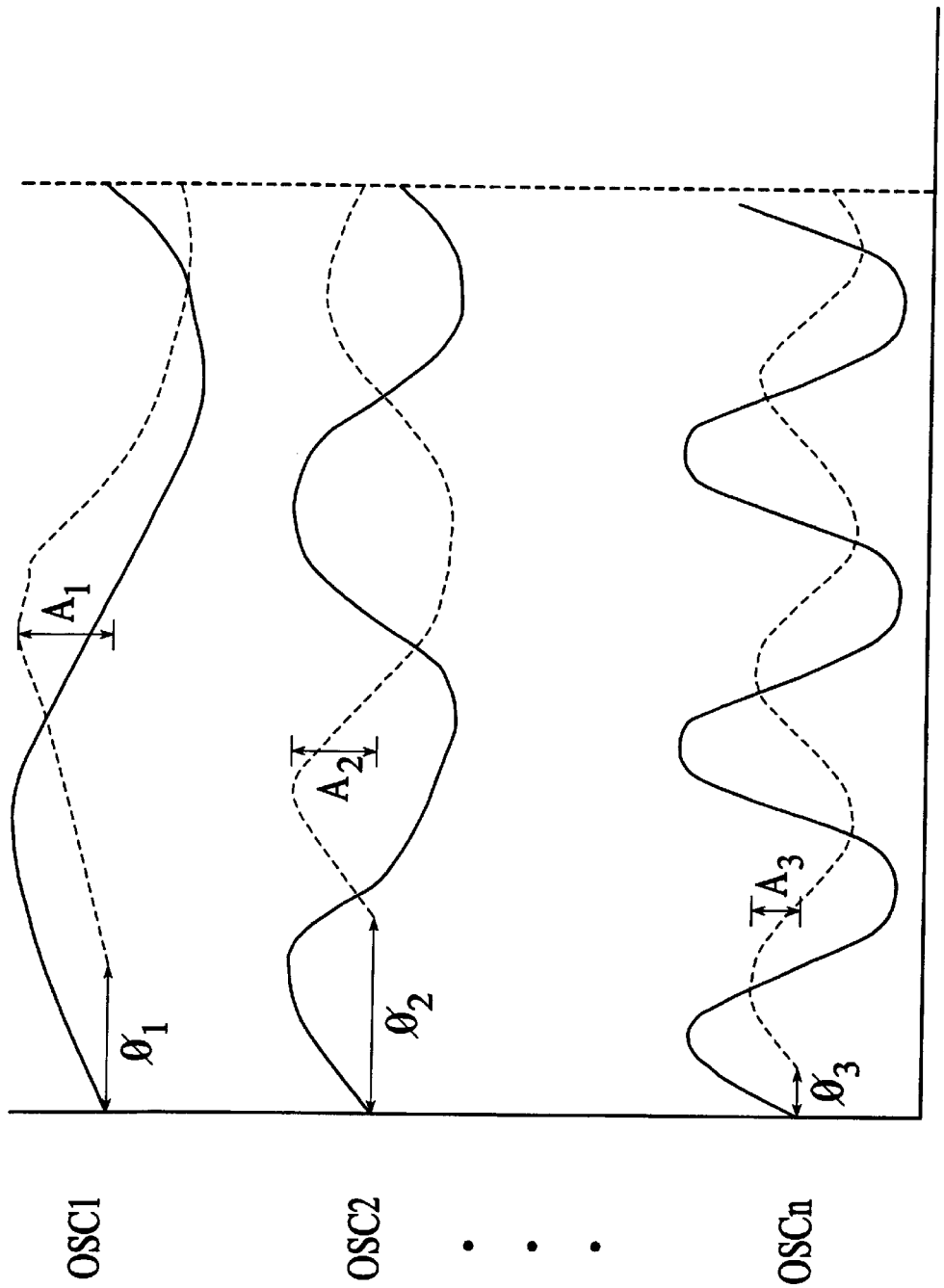
FIG. 8 shows modulated sinusoids of a Frequency Cloud utilized in FIGS. 6 and 7.

In this implementation, a series of unique and tuned sine wave generators OSC1 . . . OSCn are used to create each of the spectral components of the encoded analog baseband signal S. Each of the sine wave generators can be tuned to a common time base and amplitude range and synchronized to generate fixed and known frequencies such as 1 kHz, 2 kHz, 3 kHz, and so on. The synchronized outputs of the all of the generators containing at least one cycle of the lowest frequency generator can be seen as the reference "frequency cloud," as illustrated in FIG. 8. The time period "T" represents the minimum period of the reference "frequency cloud," as determined by the lowest frequency component OSC 1.

Next, each of the reference sinusoids is respectively modulated in amplitude using amplifiers AMP1 . . . AMPn by a number that represents an item of data that is to be encoded. If the number is 128, and the highest value that can be encoded per sinusoid is 256 (for example, 8 bits of binary data for each sinusoid), then the sinusoid is modulated by one-half the maximum amplitude (128/256=½).

Next, each of the amplitude-modulated sinusoids is further respecitvely modulated in phase by phase-shifters Phase1 . . . Phasen. The phase offset produced also represents an individual data item to be encoded. Again, if the number to be encoded is 64, the phase angle is set to 64/256 of 360 degrees, or 90 degrees.

The "reference" frequency cloud has now been modulated by the data to be encoded. The individual sinusoids are then summed together to produce the encoded analog baseband signal S, which is then ready for transmission over a carrier (could be a wire, a radio, optical or microwave signal, or even a sound wave).

Figure 7:
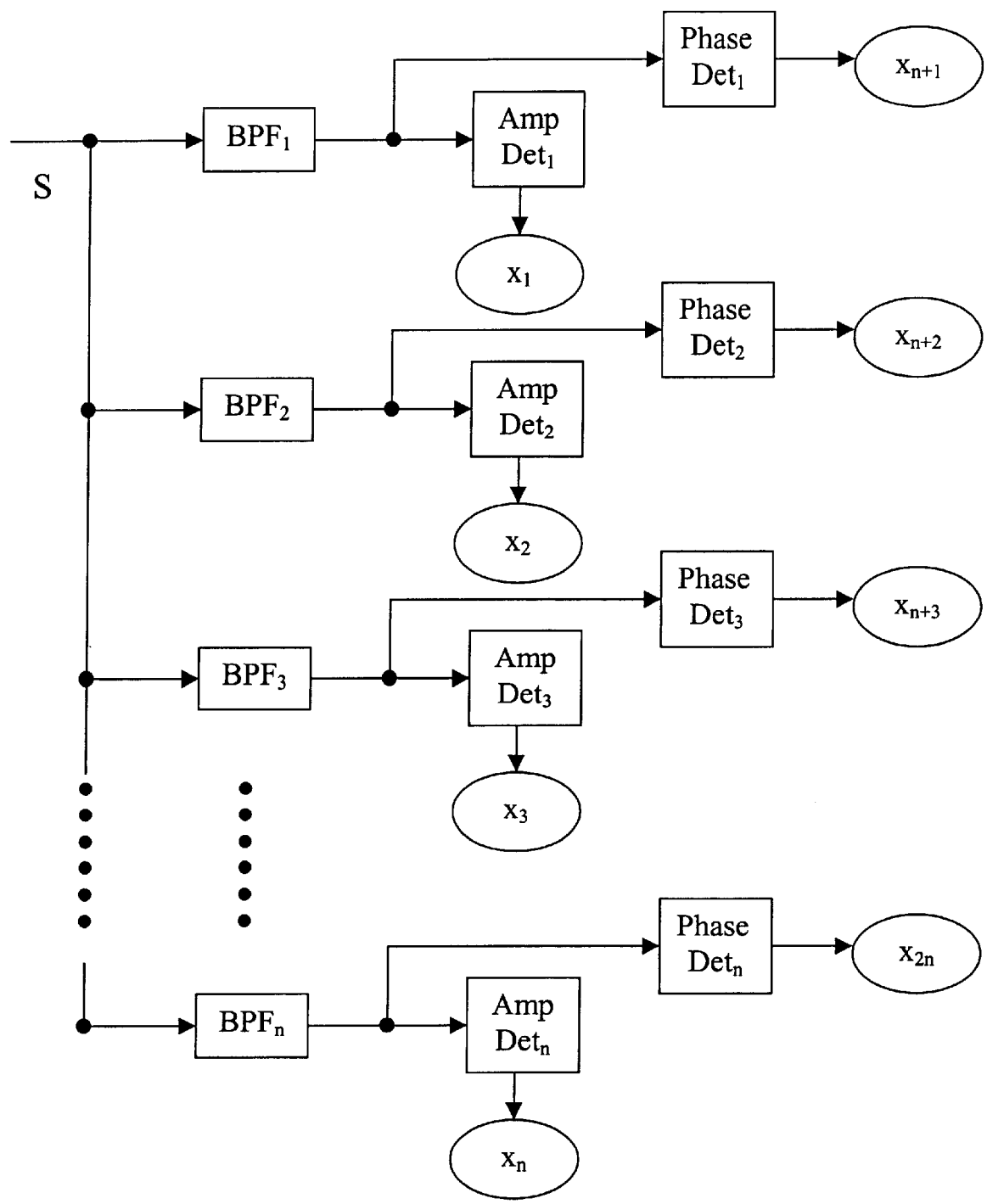
FIG. 7 illustrates a decoding system in accordance with the principles of the invention.

The receiving side of the system is illustrated in FIG. 7. It includes bandpass filters BPF1 . . . BPFn that are respectively tuned to each of the individual frequencies in the reference "frequency cloud." Each of these filters receives the encoded analog baseband signal S in common and extracts the individual sinusoid to which the filter is tuned.

Using analog comparators AmpDet1 . . . AmpDetn, the encoded amplitude data is extracted from each of the sinusoids and compared to a known reference amplitude to retrieve the encoded data. Next, pulse counters PhaseDet1 . . . PhaseDetn are used to measure the phase offset from a beginning known time reference. The detected phase offset is used to decode the encoded phase data.

Figure 9:
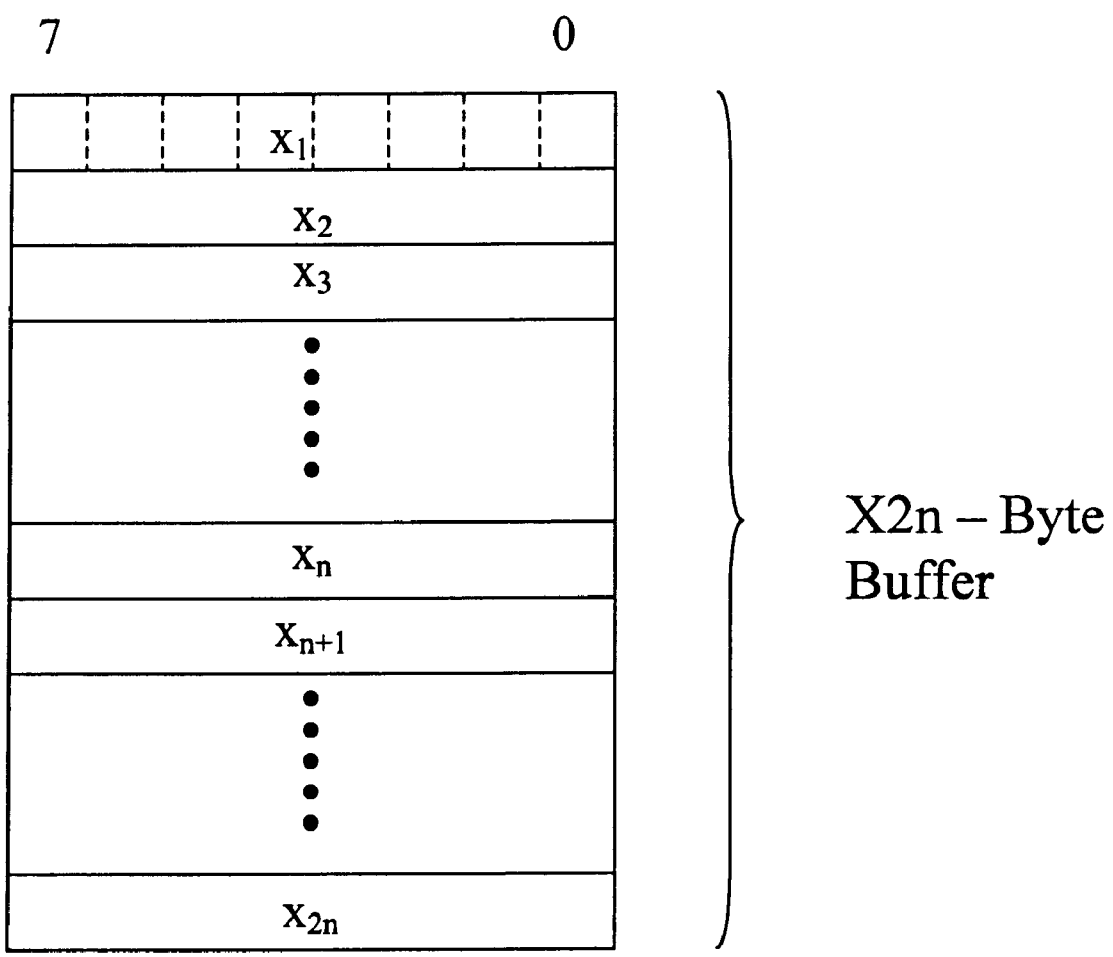
FIG. 9 illustrates a data buffer in which data to be encoded is stored, and the sequences of data mapped in the system of FIGS. 6 and 7.

Data to be encoded can be mapped to each amplitude and phase modulator of each sinusoid as shown in FIG. 9.

Consider a buffer of 8-bit words (bytes) organized sequentially. Where the number of frequencies used in the system illustrated above is n, the size of the buffer should be 2n bytes. Each byte $x_1, x_2, X_3, \ldots X_{2n}$ is then assigned to the amplitude and phase modulator shown in FIG. 6. In this example, the assignment corresponds to sequential organization in memory; however other super-sequential or even random sequences can be used.

The data output from the receiving side in FIG. 7 can be used to fill a 2n-byte buffer similar to that in FIG. 9. For true reconstruction of the data, the sequence of each byte $x_1, X_2, X_3, \ldots X_{2n}$ should be identical to the sequence used on the transmitting side.

The theoretical throughput in bits per second of the above-described system depends on the resolution R of the amplitude and phase modulators, the lowest frequency used $F_{min}$ and the number of frequencies used N, and can be expressed as:

$$BPS=(R_{amp}+R_{phase}) \times F_{min} \times N$$

As an example, consider a voice-band data modem implementing the above system over existing telephone lines (POTS), using 8-bit A/D's in the modulators and 100 oscillators spaced apart by 20 Hz and having a minimum frequency of 1 kHz up to 3 kHz. The throughput of this system would then be:

$$BPS=(8+8) \times 1000 \times 100=1.6 \times 10^6 \text{(megabits/sec)}$$

It should be noted that handshaking techniques could be used to synchronize the receiving side to the sending side so that the proper references are established. Further, a tuning process could be used to establish the bandwidth of the carrier and the resolution of individual frequency components.

It also should be noted that the above system could be realized by generating and summing the sine waves mathematically, and then placing them in the analog domain via an analog converter. On the receiving end, a DSP processor could be used to digitally filter and compare the data wherein a series of Goertzel band pass filters are used.

III. Implementation Using Digital Signal Processing Techniques

Although it has been shown above that the encoding techniques of the present invention can be implemented using well-known conventional components, efficiencies in time and design can be achieved by taking advantage of digital signal processing techniques and tools. What this section will now describe is one possible implementation of SEI in terms of using a Fourier Transform-based technique, called Discrete Fourierlets. The applications of this illustrative implementation are intended to serve as a demonstration and initial implementation of the method being described. One of the outstanding features of this particular implementation is the systemic flexibility it provides; it is applicable to any spectrum and various combinations of hardware and software realizations, and can be used for various high-level applications of SEI including communications, compression, memory, and storage systems. The implementations can be virtual, physical, or various combinations of both.

Discrete Fourierlets will be described to better illustrate the details of the concepts underlying SEI, rather than a separate detailed description of both SEI and Discrete Fourierlets.

1. Background

Worthy of mention is the fact that the litmus test for a 'Fourier Transformable' signal is that it must be physically realizable; if it is, then it can be transformed to its frequency-domain representation. The same is true for SEI, and since we can realize SEI physically by using 'brute-force' analog hardware, SEI is thus a realizable concept.

A discussion of the Fourier Transform is an appropriate segue into the concepts underlying Discrete Fourierlets. The Fourier Transform provides a tool to resolve a given signal g(t) into its complex exponential components occupying the entire frequency interval from 0 to infinity. The Fourier Transform G(f) of the signal g(t) defines the frequency-domain representation of the signal g(t) in that it specifies relative amplitudes of the various frequency components of g(t). Equivalently, it is possible to define the signal in terms of its time domain representation by specifying the function g(t) at each instant of time t.

In general terms, if g(t) is a non periodic, deterministic signal, as a function of time t, the Fourier Transform of the signal is $$G(f) = \int_{-\infty}^{\infty} g(t) e^{-j2\pi ft} dt$$

where j=sqrt(−1) and f is frequency. Inversely, $$g(t) = \int_{-\infty}^{\infty} G(f) e^{-j2\pi ft} df$$

The functions g(t) and G(f) make up the Fourier Transform Pair. For a Fourier Transform of a signal to exist at all, three conditions are required, known as Dirichlet's conditions

- that the function g(t) is single-valued, with a finite number of maxima and minima in any finite time interval
- that the function g(t) has a finite number of discontinuities in any finite time interval
- that the function g(t) is absolutely integrable, i.e.

$$\int_{-\infty}^{\infty} |g(t)| dt < \infty$$

It is safe to assume, then, that a Fourier Transform exists for any time function g(t) when it is an accurately specified description of a physically realizable signal. Physical realizability is a sufficient condition for the existence of a Fourier Transform. Thus, all energy signals, g(t), are Fourier Transformable if $$\int_{-\infty}^{\infty} |g(t)|^2 dt < \infty$$

Given this relationship, it can be stated that the Transform Pair, that are different representations of the same signal, shorthand for which is convenient like this $$g(t) \leftrightarrow G(f)$$

The Fourier Transform G(f) is a complex function of frequency f $$G(f) = |G(f)| e^{[j\theta(f)]}$$

where |G(f)| is the continuous amplitude spectrum of g(t) and θ(f) is the continuous phase spectrum of g(t). Both the amplitude and phase is defined for all frequencies, hence they are called "continuous".

Furthermore, for the special case, but common in digital signal processing on computers, is the real-valued input to g(t), giving $$G(-f) = G^*(f)$$

where the * means complex conjugation. From that we get to $$|G(-f)| = |G(f)|$$

and $$\theta(-f) = -\theta(f)$$

So, we can look at the spectrum of a real-valued signal as having conjugate symmetry, not a major point, but relevant nonetheless.

An important point that should be noted is that the relationship between the time domain and frequency domain descriptions of a signal is an inverse one. A pulse, narrow in time, has a significant frequency description over a wide range of frequencies, and vice versa. The time-bandwidth for any family of pulse signals that differ by a time scaling factor is always constant, that is:

$$\text{duration} \times \text{bandwidth} = \text{constant}$$

If the time domain description of a signal is changed, the frequency domain description of the signal is changed in an inverse manner, and vice versa.

Further, a signal is strictly bandlimited if its Fourier Transform is exactly zero outside a finite band of frequencies. When a signal is strictly bandlimited, the bandwidth is obviously sufficiently defined for the use of Discrete Fourierlets. The bandwidth of a signal provides a measure of the extent of significant spectral content of the signal for positive frequencies. Also, a signal is said to be low-pass if its significant spectral content is centered around the origin; band-pass is the significant spectral content is centered around $\pm f_c$ where $f_c$ is a non-zero frequency.

When the spectrum of a signal is symmetric with a main lobe bounded by well-defined nulls, i.e. frequencies at which the spectrum is zero, we may use the main lobe as the basis for defining the bandwidth of the signal. If the signal is low-pass, the bandwidth is defined as one half the total width of the main lobe, since only one half of this lobe lies within the positive frequency region. If it is band-pass, the bandwidth is defined as the width of the main lobe for positive frequencies.

As can be seen by the Transform Pair, filters that act upon a signal can be implemented from a time domain point of view, or, equivalently, and in certain cases, superiorly, from a frequency domain perspective.

To use the Fourier Transform in the context of numerical computation, the Discrete Fourier Transform provides an approximation of the Fourier Transform, where both time and frequency are discrete. When sampling a signal, if the samples are uniformly spaced by $T_s$, the frequency domain representation of the signal becomes $f_s = 1/T_s$ Hz. The frequency resolution involved in the numerical computation of the Fourier Transform is $$\Delta f = f_s / N = 1/NT_s = 1/T$$

where T is the total duration of the signal and N is the number of frequency samples contained in an interval $f_s$.

Given a finite data sequence $g_n = \{g_1, g_1, g_2, \ldots, g_{N-1}\}$ where the subscript is the time index $n=0, 1, 2, \ldots, N-1$, such a sequence represents the result of sampling an analog signal at times $t=0, T_s, \ldots, N-T_s$, where $T_s$ is the sampling interval, and the order of the data sequence defines the sample time in that $g_0, g_1, \ldots, g_{N-1}$ denote samples of $g(t)$ taken at times $0, T_s, \ldots, (N-1)$ respectively, we get $$g_n = g(nT_s)$$

The formal definition of the Discrete Fourier Transform of $g_n$ is $$G_k = \Sigma g_n e^{(-(j2\pi/N)kn)}$$

The sequence $\{G_0, G_1, \ldots, G_{N-1}\}$ is the fourier transform sequence, $G_k$ for short, in which the subscript $k=0 \ldots, N-1$ is the frequency index. The Inverse Discrete Fourier Transform is then $$g_n = 1/N \Sigma G_k e^{((j2\pi/N)kn)}$$

$(n=0, 1, \ldots, N-1)$
completing the Transform Pair. Given a data sequence $g_n$ we can use the Discrete Fourier Transform to compute the transform of the sequence $G_k$ and use the Inverse Discrete Fourier Transform to arrive at the original $g_n$.

Figure 10:
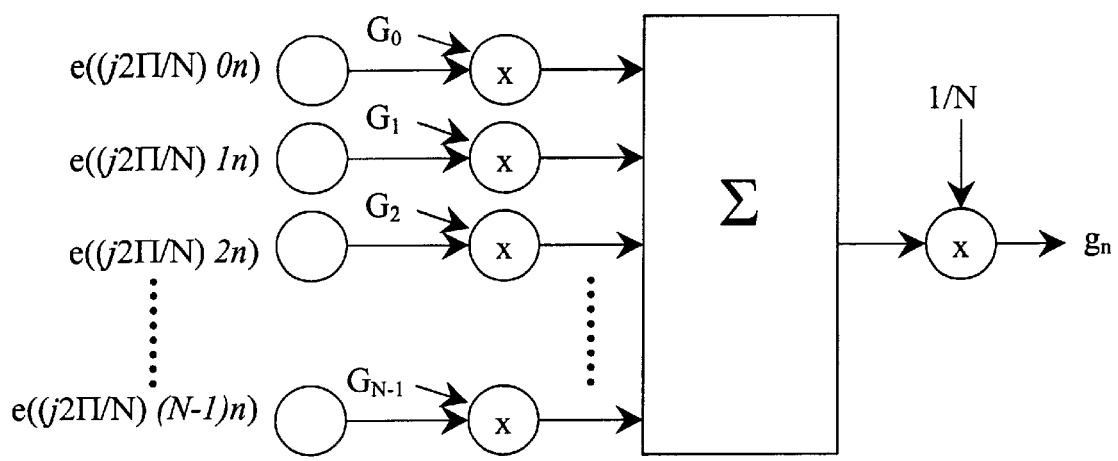
FIG. 10 illustrates the concepts of the Discrete Fourier Transform.
Figure 10:
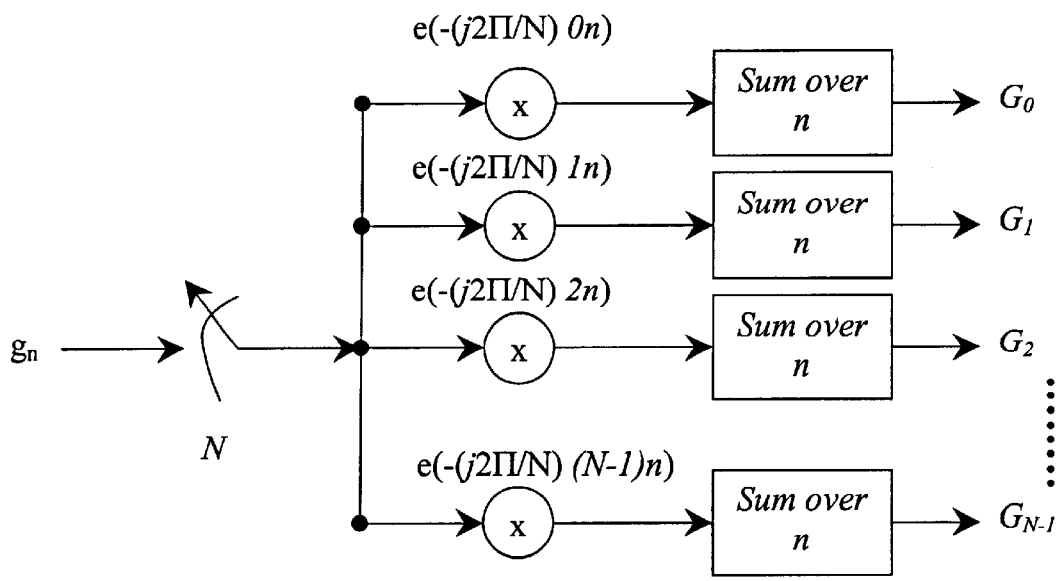

As illustrated in FIG. 10, the Discrete Fourier Transform process can be seen a collection of complex heterodyning and averaging operations because the samples of the data sequence are multiplied by complex exponential sequences. There are a total of N complex exponential sequences to be considered, corresponding to the frequency index of $k=0, 1, \ldots, N-1$ whose periods have been selected in such a way that each complex exponential sequence has precisely an integer number of cycles in the total interval 0 to N-1. The zero-frequency response $k_0$ is the only exception.

In order to overcome this basic limitation that the Discrete Fourier Transform imposes, where N given samples of an input sequence can produce only N discernable frequency components, we have several choices. One method is to oversample the input signal in such a way that the desired N observations in the resulting Fast Fourier Transform sequence can be made (via hardware or software). Another is to interpolate the space between the input samples. This is also a primary ingredient in realizing Discrete Fourierlets on a particular computer implementation.

For the interpretation of the Inverse Discrete Fourier Transform, the collection of N complex signal generators each produces a complex exponential sequence $$e(j2\pi/N\,kn) = \cos((2\pi/N)kn) + j\sin((2\pi/N)kn)$$
$$= \{\cos((2\pi/N)kn), \sin((2\pi/N)kn)\}$$

where $k=0, 1, \ldots, N-1$. Thus, each complex signal generator, in reality, consists of a pair of generators that outputs a cosinusoidal and sinusoidal sequence of k cycles per observation interval. At each time index n, an output is formed by summing the weighted (by the complex Fourier coefficient $G_k$) complex generator outputs.

The Discrete Fourier Transform and Inverse Discrete Fourier Transform are both linear operations. To make the Discrete Fourier Transform and Inverse Discrete Fourier Transform more computationally realizable, a more efficient implementation can be achieved, the Fast Fourier Transform, which basically just divides what would have been a large Discrete Fourier Transform into many small Discrete Fourier Transforms so that the Fast Fourier Transform can perform multiple small, fast Discrete Fourier Transforms. To illustrate the physical usefulness and potential of the Fast Fourier Transform in terms of computational speed an direct application is the fact that even 'low end' DSP processors can execute thousands of 1024-point Fast Fourier Transforms per second (as of 1996 that is 'low end', but not totally irrelevant, yet).

It should be noted that phase information as a quanta is also available and is subject to data encoding as well. Bits can be encoded by simply modifying the phase of a particular frequency in the context of a constellation (as in PSK techniques, for example); this occurs in addition to the other encoding that is taking place. This is done, basically, by using a phase angle to represent a bit value. Also, differential phase shift keying can be used. Another technique to use is to encode a deterministic integer value by mapping a datum to a representative phase angle.

Another implicit 'information-bearing' aspect of SEI is the notion of using a plurality of spectral packets, which allows for an optimized use of any given SEI implementation by utilizing all possible bandwidth in an efficient manner; this kind of optimization dramatically increases the data rates. This will be explained in more detail below.

2. Application of DSP Techniques to SEI

The modus of Discrete Fourierlets is the technique used in encoding digital data as described above. The details of implementation of this technique are supportive features that are novel in themselves because of what they do. It should be understood, however, that various other implementations of the encoding techniques of the present invention are possible.

The term "Discrete Fourierlets" is meant to denote the reproduction of the original Discrete Fourier Transform series that existed on the sending end, a.k.a. the Fourierlet, that had been filtered by a data filter, and "Discrete" because of the fact that the Fourierlet is discrete, and therefore temporally limited and deterministic. Fourierlets are a totally new type of information packet. They are the basis of the entire Discrete Fourierlets paradigm. A Fourierlet is, in the time domain, equivalent to a highly complex waveform pulse with altered amplitudes and phases. A single Discrete Fourierlet is equivalent to the afore-mentioned spectral packet made up of sinelets.

Discrete Fourierlets deals with the encoding of digital data into meaningful amounts of energy at meaningful frequency components of a known spectrum. The system views the signal from the frequency domain primarily, and from the time domain only to enable the orderly transfer of the message signal, and to give the Fourierlet temporal shape.

One major difference between the techniques used by Discrete Fourierlets and the conventional methods is that all conventional methods use binary signaling, i.e. they transmit and receive a bit at a time over a channel. There is literally a plethora of ways to accomplish this. Discrete Fourierlets, on the other hand, actually transmit and receive a plurality of whole, deterministic integer values at once.

Figure 11:
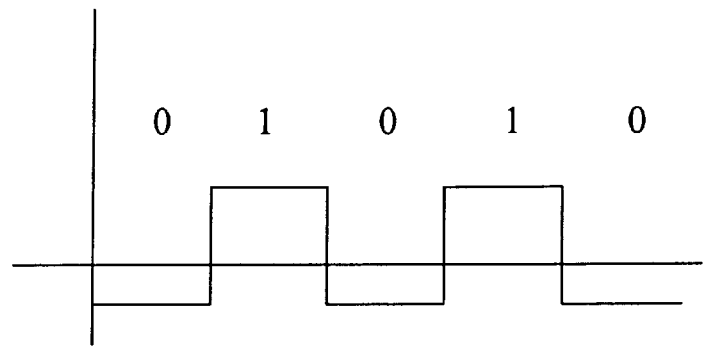
FIG. 11 compares the data handling concepts of the present invention with conventional binary signalling.
Figure 11:
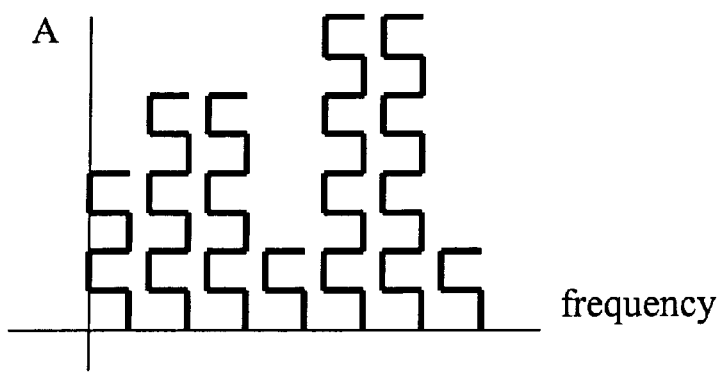

As illustrated in FIG. 11, conventional binary signaling communication systems can be represented, in very general systemic terms, as dealing with sequentially receiving bits at a time, i.e.:

bits are going in this direction→
time is going in this direction→

Discrete Fourierlets as a communication system, on the other hand, is more 'holistic,' so to speak, i.e.:

bits are going in this direction↑ time is going in this direction→

The systemic amplitute determines the number of bits, i.e. the range of integer values, what we call deterministic integers, that can be stacked in this manner. For 8 bits of resolution, the values would be 0 to 255, and for 16 bits, 0 to 65,535. Also available are the various phase angles of each Discrete Fourierlet member frequency.

Figure 12:
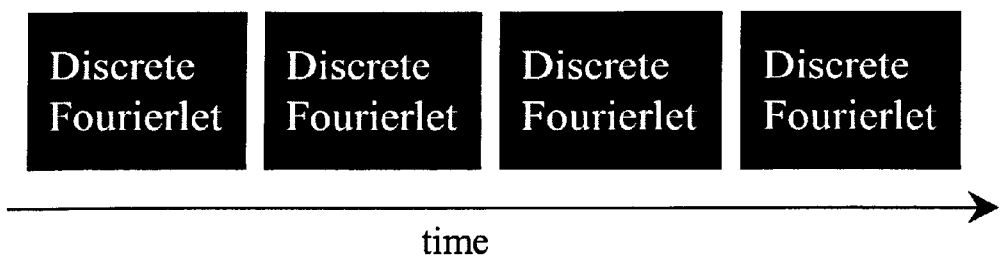
FIG. 12 illustrates a time-domain representation of an encoded signal with Discrete Fourierlet packets.

Throwing the conventional notion of bit-wise signaling on its ear, Discrete Fourierlets allow for much greater information content in relation to time. One way to visualize Discrete Fourierlets is to view it as a spectral packet, where the digital information is contained within a spectrum, having some kind of temporal definition of boundaries, as illustrated in FIG. 12.

There are two main components of the encoding modus:

primarily, the deterministic instantaneous energy of a sinusoid of a particular frequency. This is relevant because of the relationship between time and the Fourier Transform pair. A spectrum can be represented in different ways, in the time domain.

secondarily, the fact that many, many frequencies are used in concert

Interpolation and decimation of the time signal are enabling aspects of how the signal is optimized in a highly efficient manner; the representation of a spectrum is simply altered to suit a particular need, as defined by the SEI concepts. These two techniques will be discussed in more detail below.

Discrete Fourierlets is neither a Continuous Wave (CW) system, nor is it a typical Pulse Modulation (PM) system, nor is it a Time Division Multiplexing (TDM) or Frequency Division Multiplexing (FDM) system; it can be viewed as analagous to a cross section of all three. In general, it does not concern itself with the rate of change or the juxtaposition of any quanta, nor does it transceive data in a linear bit-wise fashion.

A CW carrier uses a sinusoidal wave as the carrier, and various CW techniques use different aspects of the wave to transmit information, like amplitude modulation, angle modulation, or quadrature techniques that may use both of these. A PM carrier generally consists of a periodic sequence of rectangular pulses. A TDM system uses PM to position samples of different message signals in non-overlapping time slots.

Discrete Fourierlets deal with deterministic measurements that exploit four aspects of viewing a signal entirely from the frequency domain (one side of the Transform Pair):

Time

A pulse, narrow in time, has a significant frequency description over a wide range of frequencies, and vice versa. Also, time-domain representations of a spectrum can be altered to fit a particular need.

Amplitude

The amplitude (i.e., "energy") of a frequency is readily subject to modification via linear filtering.

Frequency

Frequency content of a signal is also readily subject to modification via linear filtering.

Phase angle

The phase angle of a localized observation of a particular frequency is also subject to linear filtering.

The relationship between these three aspects is what makes Discrete Fourierlets possible; by viewing the message signal from the frequency domain and the time domain, a hybrid time-frequency technique is possible. Phase can also play an important role in this relationship in that it is an available information-bearing attribute of the message signal. By modulating the phase of the various sinusoids a fourth dimension is added to Discrete Fourierlets, and bit information can be carried by various techniques.

The role Time plays in this view is that many time domain pulses of very complex spectral content can be sent and received in a very short amount of time. There is a huge amount of spectral information that can be thusly transceived by being able to send many pulses of these complex waveforms every second. They key issue in this regard is that the spectral content must be generated quickly enough from the sender's point of view, and detected quicly enough from the receiver's point of view. As mentioned earlier, interpolation and decimation play a key role on either side of the sender and receiver as well.

SEI Amplitude, Frequency, and Phase modulation provide the details of the spectral content within the context of time in a controllable way. This task is performed by the Fourierlet Shape-Shifter, so named because it alters the shape of the Frequency Cloud (to be described in more detail below) to represent the desired digital data as a desired spectrum that can be viewed from both the time and frequency domains.

At the Discrete Fourierlets sender end of a connection, Discrete Fourierlets uses a technique whereby instantaneous energy of a known spectrum is encoded to represent a discrete value. Once the encoding is done, the signal is transformed into the time domain so that it can be transmitted across the channel. Each time this occurs, it occurs at a discernable time (exactly how that time is determined can be any technique that is used for synchronization, particular to the exact requirements of a given implementation). This results in a burst of energy at a number of frequencies; the burst may be continuous, but changing, or it may be binary: on/off, burst/no-burst; this depends on what particular implementations may decide upon as optimal for a given physical medium. Either way, given that some kind of synchronization has taken place, the message signal (independent of what the actual physical carrier is) is a highly complex, bandwidth- and power-optimized waveform. The number of frequencies used could be tens, hundreds, or even thousands.

At the receiver, the signal is not viewed as a pseudo-random signal with the typical attributes expected in a probability-driven paradigm, but rather as a signal that has been received from a discrete and tuned information source that is subject to information gathering techniques that almost instantaneously reduces the amount of uncertainty to zero.

This is a fundamental difference between Discrete Fourierlets and the current genre of communications protocols. In this case, the view of the outgoing signal from an information source is something that has been agreed upon by both the sending and receiving ends; the receiver therefore does not have to grasp at straws (such as with probability theory) to reconstruct the information that it was intended to receive. Rather, the receiver has a significant degree of knowledge about the expected deterministic signal, and can use that information in error correction due to line noise, crosstalk, and so on. But even these factors can to a significant degree be 'tuned out'; when two ends tune to each other, they are really engaging in a dialogue that describes the particular characterisitics of a physical medium to each other, so each end acts upon the knowledge it has gained from the dialogue, forming a deterministic signal due in part to this mutual consent. It is with equal simplicity that the two ends of a connection can dynamically adjust to changing circumstances by periodically re-tuning themselves to each other; of course, this would result in a degradation of overall throughput, but it would also reduce the possible error rate dynamically and adaptively set the maximum throughput of a connection.

In essence, Discrete Fourierlets are possible because of being able to control the various energies in a spectrum being able to reveal those energies, and being able to represent a spectrum in different ways This is accomplished by firstly matching an available bandwidth, and either oversampling or interpolating or both (in hardware or software, or both) at the receiving end to reveal the various encoded energy details in a spectrum, for example. This is different from even the 'new' US Robotics 56 k modem in that their technique is to send PCM codes (from 0–255) over a phone line. While this does increase the bit rate for phone modems, it is not a general solution, and it ignores the spectral content of those very PCM codes. It simply uses the fact that the most digital degradation a signal will have to endure is an 8 kHz, 8 bit sample rate, and the fact that the PCM codes sent mean nothing in terms of describing a spectrum.

The present invention takes into account that N bits of magnitude resolution are available, and applies this maximum resolution to the entire dynamic range. Discrete Fourierlets uses a complex waveform made of N frequencies and changes the energy present at a particular frequency to represent a digital value. The frequency domain packet is then transformed into a time domain signal, and transmitted. At the receiving end, the signal is oversampled (via software or hardware), transformed into the frequency domain, and analyzed for energy content, where certain predetermined energy thresholds represent multi-bit values. The oversampling rate required is calculated like this. Where number of frequency packets per second Fpps=lowest useable frequency, and desired number of frequencies to use is Nf, the following relationship applies:

$$\text{required 'over' sample rate } Rsr = Fpps \times Nf$$

yielding a spectral energy resolution far greater than would have been available if one were to use the sample rate merely sufficient to reconstruct the original signal bandwidth. By oversampling, the details of the spectral content of a signal are revealed. The oversampling can be accomplished using software interpolation techniques, or by using hardware (A/D devices that can sample at the required rate), or, most importantly, by a combination of both.

In addition, since most analog-to-digital and digital-to-analog converters use oversampling in their process of creating PCM codes, even at the stage where we are concered about the the quality of the observations of a deterministic signal, we are guaranteed a very good approximation of both the signal as it existed in analog form, and the Discrete Fourier Transform approximation of the Fourier Transform when reconstructing Discrete Fourierlets at the receiving end of a connection. This fact leads to a great deal of stability in the underlying source of signal observations, and thus spectral information, from a digital and analog standpoint; like a good foundation for a house holding up the roof securely.

Both oversampling and interpolation are feasible, and actual use will highlight the pros and cons of each. Without software interpolation, standard forward discrete fourier transform techniques can 'detect' only N frequencies for every N number of observations of a given signal. Given that Shannon's sampling theorem dictates that to sample a signal of bandwidth $F_s$/sec, we must at minimum sample it at the rate of $2F_s$/sec, and that the interval between each sample is ½$F_s$ seconds. When this requirement is combined with the way most discrete fourier transforms work, the maximum spectral differentiation is determined by the Nyquist rate of $2F_s$ samples per second, and specifically, the number of frequencies that a FFT can produce for every N samples is N/2 due to the Nyquist theorem.

It should be noted that the entire signal's frequency spectrum is contained within every point of observation. By oversampling or interpolating a signal, the present invention sufficiently overcomes any obfuscation of spectral details without having to do anything to the available dynamic range. Thus, it does not matter that a signal is oversampled, other than the fact that more observations are available, and thus more details are visible; its spectral content remains the same.

When combining the notion of oversampling with the ability of controlling spectral energy content (via a frequency domain linear filter), a method is devised whereby the fine-grain details of even very limited frequency ranges can yield large amounts of information, even in situations where the magnitude range has been 'clipped', as in the case of the 8 bit digital phone line connection. This merely means that 256 different magnitudes can be detected, no matter how many one started out with.

The lowest frequency used determines the highest packet rate. Also, for every doubling of over-sample rate, there is a corresponding doubling of the packet rate. For example, where only magnitude modulation is used, the overall bit rate becomes $$\text{bits per second} = \text{number of magnitude resolution bits} \times \text{packet rate} \times \text{number of frequencies used}$$

It should also be noted, of course, the overall bit rate will be multiplied by another magnitude resolution factor when phase modulation is also used.

3. Timing Signals

A systemic semaphore carrier is an essential that supports Discrete Fourierlets by providing what is used by the tuning process, and any other systemic signaling. Anything that the Discrete Fourierlets system has to take care of internally, in order to provide its own internals a method to manipulate its state, is accomplished via this 'other' signal; in turn, it enables much of the Discrete Fourierlets from a system's point of view.

This 'other signal' can be anything that a particular implementation may find useful, and as such, is not really a deterministic part of Discrete Fourierlets other than the fact that it must exist. Consider for example a phone line that carries the Discrete Fourierlets. In such a system, the engineer may take advantage of several existing, known types of signals and messaging systems in order to provide the underlying systemic signaling that implements Discrete Fourierlets.

For example, the framing of each fourierlet is taken care of by such signals, thus providing the overall increase in data rates. The process of having to re-tune a connection may also be taken care of at this sub-signal level, however, there may not be a need to use a sub-signal at all, on certain implementations. These will tend to be systems where there is a physically realizable ideal, where we do not have to take extra care in tracking line characteristics.

The systemic semaphore carrier could be anything that is useful to a particular implementation. For example, given the phone-line example, a PCM key sequence may be the signal, or perhaps some unused frequencies are available that are generated at either end via digital synthesis and detected via Goertzel filters; the point is, there is a certain amount of application-specific effort that must take place in order to fully set up and realize Discrete Fourierlets on a given application. This substrate allows one to build upon it with Discrete Fourierlets.

Note also, that in the absence of a native carrier, Discrete Fourierlets can be used alone, without the need for any sub-signal. In such an event, there will be systemic Discrete Fourierlets, used for fourierlet framing, re-tuning requests, etc.

4. The 'Tuning' Process

So that Discrete Fourierlets can fully exploit the use of a given channel, a process called tuning takes place at the first stages of setting up a connection. During this process, channel characteristics are identified and remembered so that any interfering characteristics can be compensated for. One way to think of this is like an orchestra that needs to determine what notes on what instruments sound good in a particular room, and also which loudnesses are discernable and which are not.

The tuning process can take care of several aspects of the communication system's supporting infrastructure by determining the Frequency Cloud as the first stages of forming a connection, such as:

dynamically determining the message signal bandwidth dynamically determining the amplitude resolution of the channel, including power loss determining the symmetry between the two ends of the connection as far as the number of frequencies used is concerned. In other words, if the sending end sent 1024 encoded frequencies per Discrete Fourierlet , then the receiving side must expect 1024 frequencies. This can literally be agreed upon, and both sides can have the same knowledge of any and all systemic parameters.

and also provides error correction—like echo cancellation, etc.

It is in this way that the particular spectral shape prototype, referred to as the Frequency Cloud, for a given channel is determined at connection time. This technique gives rise to the notion of letting each end of the connection have its say about what it is ready to do, thus creating a communication system that is superbly adaptive and simple.

The Frequency Cloud (referred to as "FC" hereinafter for brevity) is a discrete-time spectrum that will be used to carry data within its various frequencies. A FC is constructed either before hand or dynamically, and has its beginning in a digital reference signal. Exactly how that reference signal is arrived at depends on a particular SEI implementation, but in general, in can be synthesized, and sampled from another real world signal In any case, the reference signal must be some form of representation of a real world signal, one that is considered to be valid by any DSP system. One can think of it as a spectral "stamp" that is used as a vehicle for transport.

Figure 13:
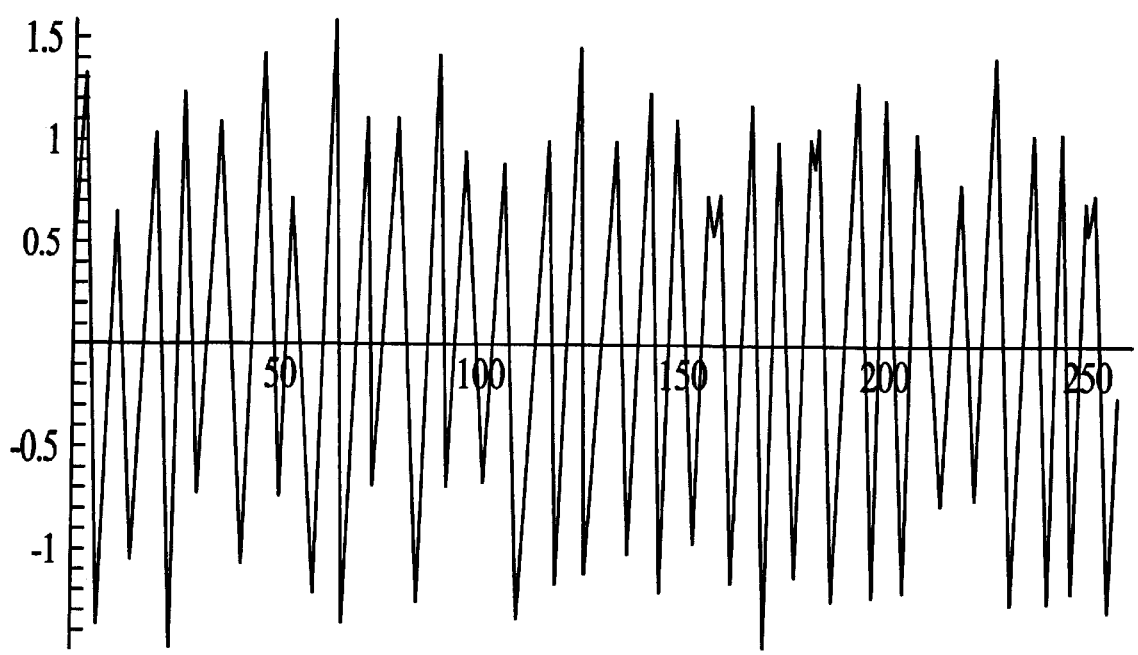
FIG. 13 illustrates the time-domain representation of a reference frequency spectrum.
Figure 14:
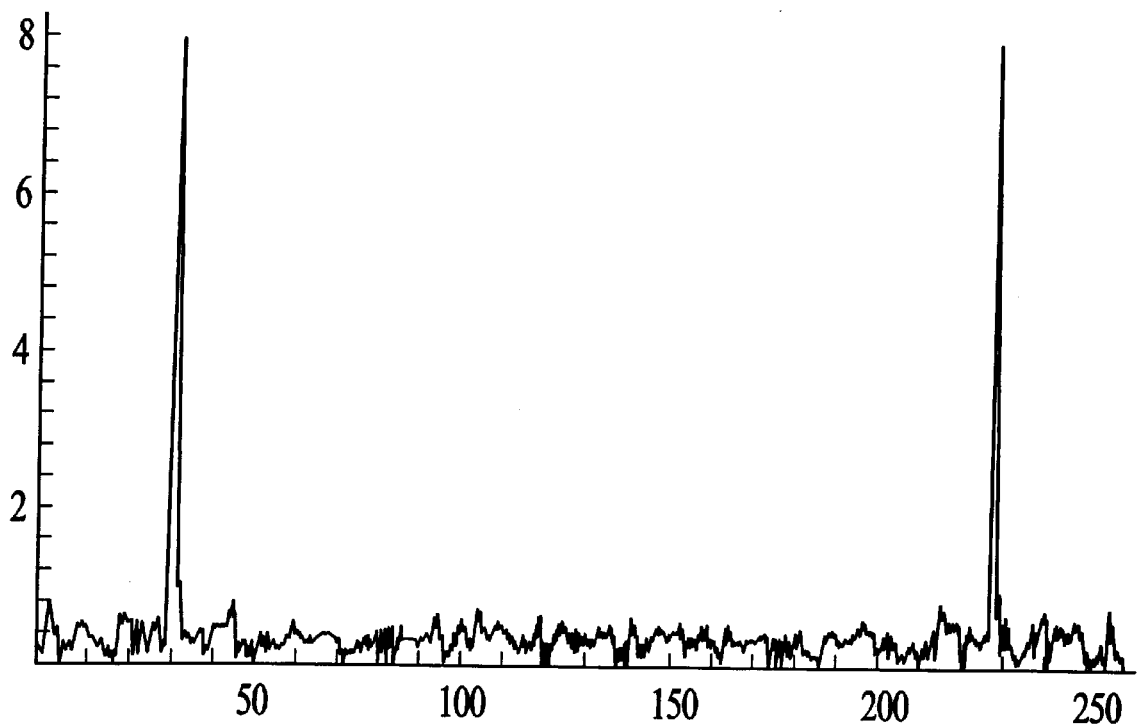
FIG. 14 illustrates the frequency-domain representation of a reference frequency spectrum.
Figure 15:
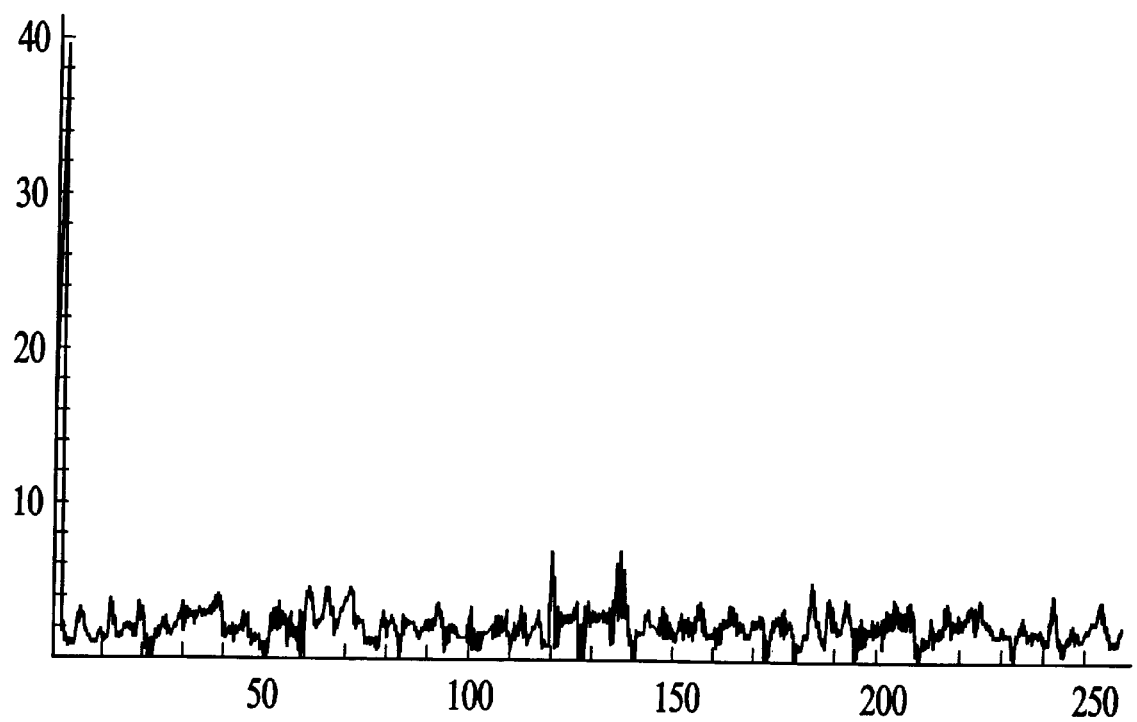
FIG. 15 illustrates the information storage capacity of the spectral components of an encoded spectrum.

The FSS (Fourierlet Shape Shifter) is the entity responsible for combining a particular data buffer and the FC, resulting in a short-lived modulated FC that is used for transmitting or storage. For example, consider a time domain view of a reference signal as in FIG. 13. It is finite in time, and provides all the spectral content required. This signal can be viewed equivalently in the frequency domain as in FIG. 14. In this case, looking at the amplitudes of each frequency shows that there is much information storage capacity as amplitude-encoded data, as is shown in the following FIG. 15. Each of the frequencies is carrying data via its amplitude. This is what the FSS does when it uses the FC as a stamp and creates afourierlet, a short-lived, data-bearing spectral packet.

Figure 16:
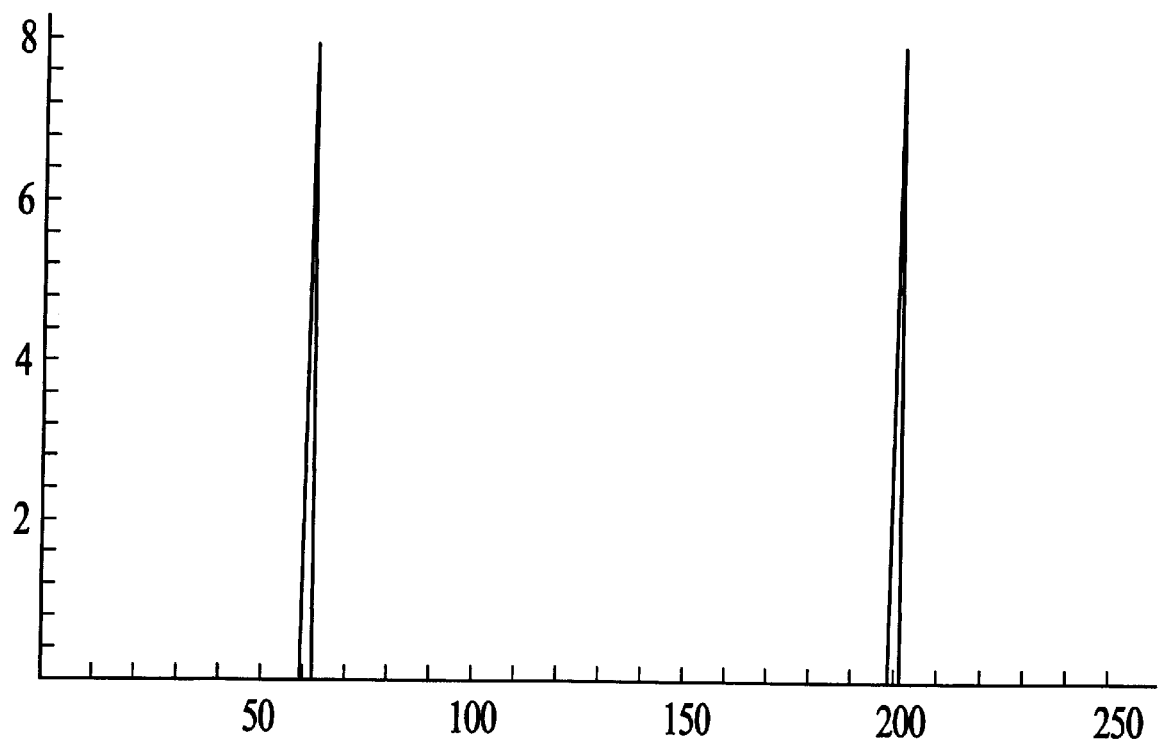
FIG. 16 shows the frequency characteristics of a Fourierlet created by a Fourierlet Shape Shifter according to the present invention.

For clarity, the next figure FIG. 16 shows a fourierlet that has been created (emitted) by the FSS. The data encoded within the spectrum are the values 8 and 8 at 60 Hz and ~190 Hz. The FSS gets its name from the fact that it periodically emits spectral-shape shifted versions of the FC, called fourierlets.

Also, in addition to amplitude mapping of data within a spectrum, it is possible to take advantage of the phase angle properties of each fourierlet, since, again, it is a discrete time signal, and thus finite and deterministically bound. For the sake of brevity once again the figures showing phase modulation of a fourierlet is omitted.

The number of frequencies or number of observations within the FC is a matter of particular implementation as well; sometimes it will be in 'expanded' form, in other environments it may need to be in 'compressed' form. But since we have control of which form we use for an implementation via an understanding of the system, at this level, as a true multirate system, we can safely leave those details to whatever particular incarnation.

This technique gives rise to the notion of letting each end of the connection have its say about what it is ready to do, thus creating a communication system that is superbly adaptive and simple.

To allow for potential loss of power over a channel, the tuning process can include a power loss detection algorithm that will equalize the amount of amplitude used in the encoding of the data at the transmission end. For example, on a lousy connection, it may be determined that only 4 bits of amplitude resolution is reliable, an unforeseen impediment to which the Discrete Fourierlet algorithm easily adjusts.

To allow for sometimes unpredictable line errors, the tuning process can take place at a definable interval to retune the connection. In this way, if total bandwidth should abruptly fall off, the system will recover, and offer better throughput than if most of its time had been spent correcting errors; conversely, if the channel bandwidth should increase, the system will adjust and increase the throughput. This can be implemented as an "adaptive filter" that performs system modeling at certain intervals.

5. The Fourierlet Shape Shifter

Figure 17:
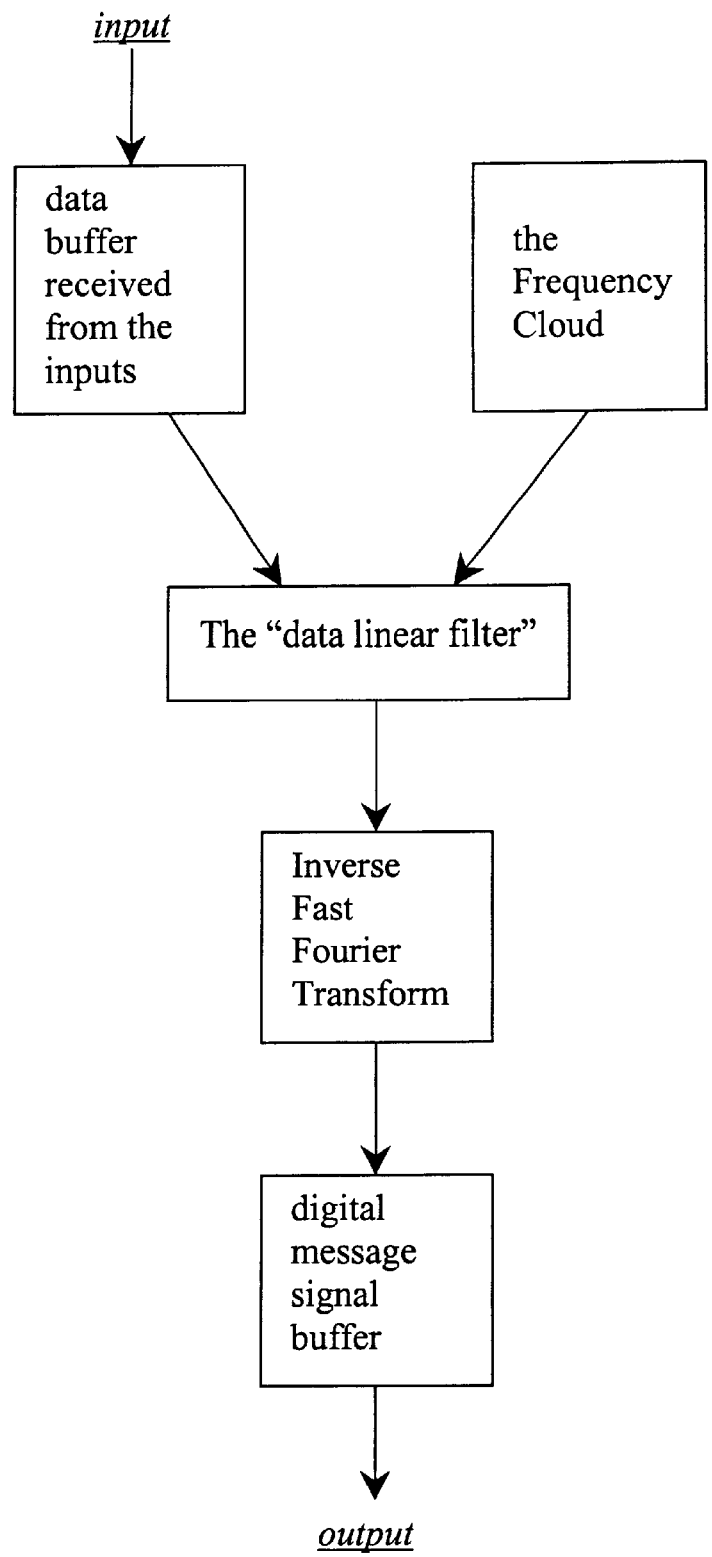
FIG. 17 illustrates a block diagram of a Fourierlet Shape Shifter in accordance with the present invention.

As illustrated in FIG. 17, the Fourierlet Shape Shifter comprises the three components that actually map the data to be encoded into a spectrum a linear filter that literally encodes the data into the Discrete Fourierlet the Frequency Cloud an Inverse Fast Fourier Transform to reconstruct a time domain signal (for either real or virtual transmission; please refer to the description of using Discrete Fourierlets as a compression technique)

Figure 18:
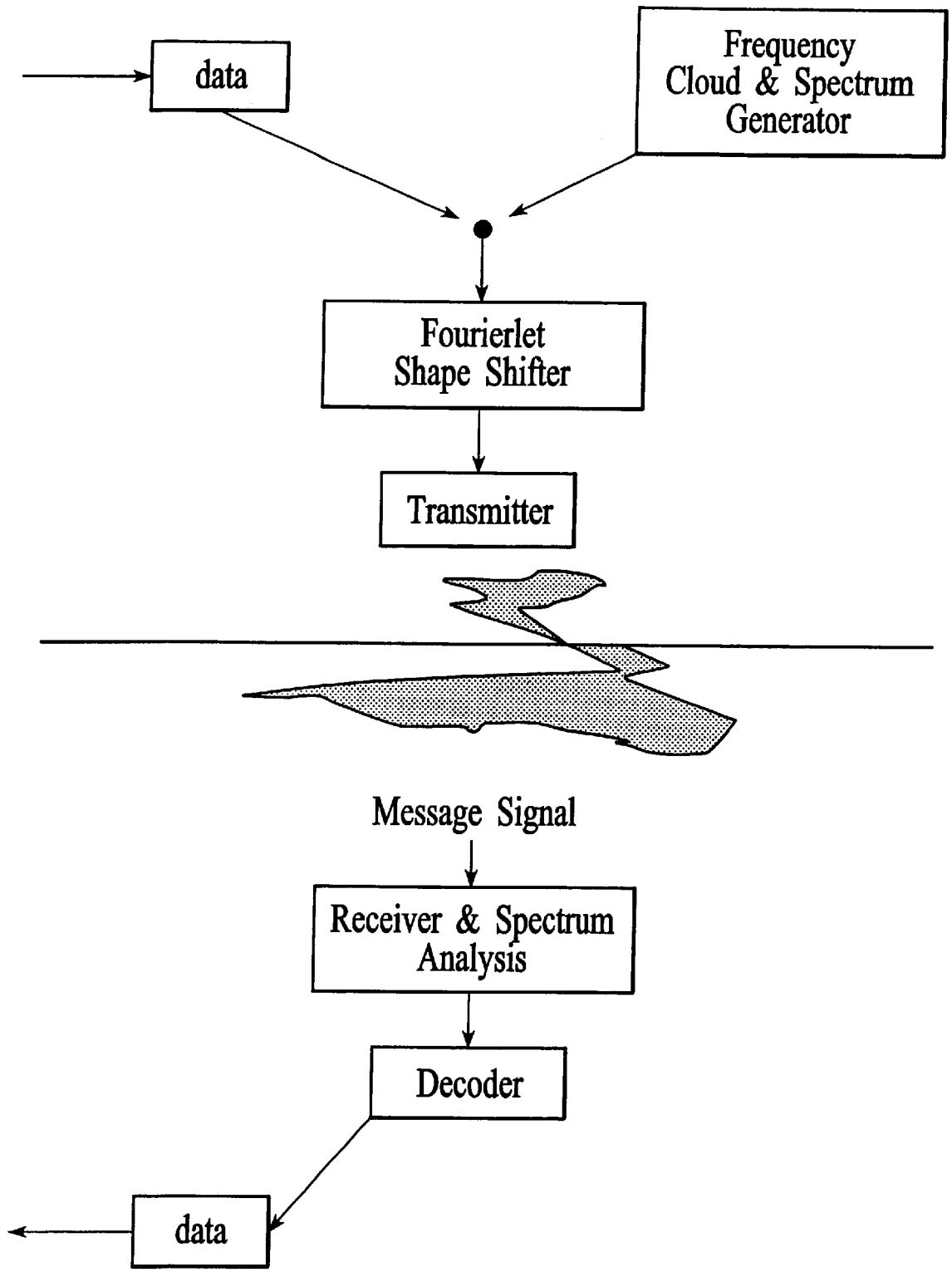
FIG. 18 illustrates a block diagram of a system using a Fourierlet Shape Shifter.

As can be seen from the FIG. 18, the data to be encoded is made available to the input of the Fourierlet Shape Shifter. The linear filter calculates a new shape for the Frequency Cloud (the prototype Discrete Fourierlet), after which an Inverse Fast Fourier Transform readies the signal for transmission. In this implementation, the Spectrum Generator is actually the Frequency Cloud, which has been formed by the tuning process or some other means meaningful to a particular implementation. The Frequency Cloud is capable of generating the spectrum because it is a Fourier series, or equivalently stated, it is a collection of complex signal generators.

The linear filter acts upon the Frequency Cloud by calculating new amplitude and phase values for a given Discrete Fourierlet frequency component, denoted by $DF_k$.

The new amplitude of a given frequency component of a Discrete Fourierlet is calculated by acting upon the complex signal generator present at that index within the Discrete Fourierlet series by several steps:

(1) calculate the ratio c $$c=M/\mathrm{sqrt}(r^2+i^2)$$

where M is the desired amplitude, r is the real portion of the complex number, and i is the imaginary. In this case, M denotes the actual data value it is intended to represent, directly.

(2) calculate the new r and i $$r_{new}=cr$$
$$i_{new}=ci$$

(3) now the desired M is verifiable by checking M $$M=r_{new}^2+i_{new}^2$$

(4) and the ratio c can be verified by checking M $$M=c^{2(r^2+i^2)}$$

(5) the new r and i replace the original r and i.

To calculate the new phase angle that the $DF_k(n)$ is to contain:

(1) we start with the simple calculation of radians per second, or phase angle, $$\theta=\tan^{-1}(i/r)$$

(2) In order to meaningfully encode a datum we must first agree upon its bit resolution, meaning 8 bits, or 16 bits, whatever. From this we know by how many degrees each deterministic integer is from the next. Instead of encoding a value a single bit at a time, we encode a whole integer at a time. Since 180°=π radians, we can use π to calculate the ratio c $$c=\pi/x$$

where x is the maximum value possible at a given bit resolution.

(3) From this, we get $$\mathrm{new}\theta=cd_v$$

where $d_v$ is the actual integer value to be encoded.

(4) At this point, we recalculate the old real and imaginary parts to reflect the desired newθ. Given that $$x=\tan^{-1}(\mathrm{imag/real})$$

(5) we can reduce the equation in terms of either the imaginary or real part $$\mathrm{imag/real}=\tan(x)$$
$$\mathrm{imag}=\mathrm{real}*\tan(x)$$
$$\mathrm{real}=\mathrm{imag}/\tan(x)$$

(6) and then solve for some ratio c to change imag and real to yield a desired x so that desired x=tan(imag/real)

$$c=a-(b\ \tan(\mathrm{new}\theta))/\tan(\mathrm{new}\theta)-1$$

(7) we can calculate the new imaginary and real parts $$i_{new}=\mathrm{imag}+c$$
$$r_{new}=\mathrm{real}+c$$

(8) and the desired x should then be evident in $$\mathrm{desired}\ x=\tan^{-1}(i_{new}/r_{new})$$

Note that a special case exists for the condition where an amplitude has been coded to 0 in that no phase information is available for that Discrete Fourierlet component, and as such will not be used. Since the data buffer to be encoded is taken one datum at a time, at whatever determined bit resolution, the fact that encoding via phase angle modulation may not always be possible has no impact at all. The datum that would have been encoded in the phase angle will simply be the datum used to encode the next Discrete Fourierlet component's amplitude. In this way, no datum is skipped. Clearly, the implication of this is that sparse buffers of data to be encoded are slightly less efficient. The final all-important stage in readying a signal is how it is constructed. This is also an essential ingredient of SEI in general, and as is described here, is one of many possible techniques to implement the concept.

To support the realization of Discrete Fourierlets described above, it is preferable to use:

a fast complex-waveform synthesizer a customized fast forward fourier transform and filter to transform digital data into the frequency domain at the sending end special handshaking techniques for system 'tuning' error correction algorithms an overall protocol (called "mission"—part of interNuncio) to drive the message signal (like TCP/IP on Ethernet, for example) within the context of an Operating System running on a computer.

6. Yet Another Angle

Now that the basis of Discrete Fourierlets has been described, there are two very important aspects that will now be addressed:

(1) Discrete Fourierlets Can be Used Recursively

This is not so much a feature of Discrete Fourierlets themselves as it is a characteristic of SEI. Consider a channel whose characteristics the tuning process has determined are that the practical available bandwidth is 10 kHz, from 10 kHz to 20 kHz. When we look at using the upper range of the bandwidth, it is obvious that the lower end of the spectrum will not yield significantly more information, and will in fact impede any kind of further optimization.

Recall that the rate of information sent (neglecting magnitude and phase bit resolution) depends on the lowest frequency used and the packet rate. If 1,000×3,000-frequency Discrete Fourierlets per second were to be used, the lowest used frequency in this case is 1 kHz. The total throughput is, from that, 3,000,000 pieces of information per second. Now, if we used 2,000×2,000-frequency Discrete Fourierlets per second, that would yield 4,000,000 pieces of information per second, at a 30% increase in total throughput with less frequency content. Clearly this indicates that for any single Discrete Fourierlet prototype there exists an optimum realization. This determination is part of the tuning process.

This is not the only way to squeeze even more information into Discrete Fourierlets (or any other SEI implementation for that matter). The spectra around the optimized, main Discrete Fourierlet can also be used in a similar manner. What can remain is some unused frequencies that might not add significantly to throughput, and may thus stay unused. So what the net effect of using Discrete Fourierlet in this way is that they are now several optimized sub-spectra of the overall spectrum. In part this is possible because of the very intricate timing signals used to frame each Discrete Fourierlet at both the sending and receiving ends.

In such a system, one might have a Discrete Fourierlet using the 'main' optimization of 2,000×128-frequency spectrum, and several other Discrete Fourierlets occupying also the upper end of the available dynamic range, say 4,000×32-frequencies, and the low end, at 200×512-frequencies. Obviously, not only do the advantages of the main Discrete Fourierlet yield a very good reason to have an optimistic view of the world, but also the resulting unutilized spectra can be used to push the information-bearing capabilities of SEI Discrete Fourierlets even further. The method used for timing signals is an enabling aspect to this technique.

(2) Expansion and Compression Play an Important Role

Another aspect that has been referred to several times already is the use of interpolation and decimation of the time domain representation of the signal before it is actually transmitted. Consider the case where it has been determined that a usable spectrum is from 1 kHz to 4 kHz; ignore the amplitude and phase encoding aspect for right now. Also consider that we are using 256 different frequencies ($f_A$) within each Discrete Fourierlet. The overall parameters are defined by:

the highest frequency used and
the lowest frequency used

Decimating to the most minimal representation of the spectrum in this case, the highest frequency determines the sample rate minimum needed to losslessly represent the spectrum; this is defined by the Nyquist rate, giving us 8 kHz.

The lowest frequency used determines the Discrete Fourierlet period $P_A$, in this case 1 kHz, and defines the implied sample rate of the time-domain signal that the Fourierlet Shape Shifter produces, which is total number of frequencies used ($f_A$)*fourierlet period ($P_A$)
(256)×(1,000)=256,000 Hz Clearly, the signal is in reality vastly over-represented and must now be matched to some practicable rate, presumably, and usually, the rate that a channel can handle. Communications over phone lines, for example, typically operate at a maximum of 8 kHz, which is sufficient for the present invention since in this case the spectrum is chosen to match this requirement, not using anything above a frequency of 4 kHz. By decimating the 256 kHz representation of the bandlimited spectrum to 8 kHz, we lose no spectral content, and we have altered the time domain representation of the spectrum to a minimum. At the receiver, the 8 kHz signal is interpolated via software (but not linearly) to the known rate required to reveal the spectral details, in this case 256 kHz. In general, the practicable minimized sample rate is defined as $R_m = f_h * 2$ where Rm is the minimized sample rate and $f_h$ is the highest frequency used. This defines the theoretical limit of SEI compression.

The actual interpolation and decimation techniques used are common in the digital signal processing world; they can be used mostly as-is because of the fact that the SEI encoding has taken place, and what we are then dealing with is by all intents and purposes a real time domain signal that is as such subject to many established, proven DSP techniques. An intriguing aspect of these factors is that the transmission channel can be virtualized, yielding an ideal signal free of noise, echo, and degradation that can be 'virtually sampled' using a 'virtual codec' and 'virtual channel', and all filters are truly 'ideal'. Stated another way, this means that SEI can be cascaded without loss. Also, Descrete Fourierlets for transmission can be used in conjunction with Discrete Fourlets for compression to increase throughput.

7. Miscellaneous Notes the Discrete Fourierlets can be used to drive any other message signals, including optical, satellite, mobile radio, and so on.

the Discrete Fourierlets can be used as the primary signal in a system.

Discrete Fourierlets as a realized system can easily be recursive to some degree N to 'pre-compress' the signal before it even gets transmitted. This means that Discrete Fourierlets can use itself to, for example, first compress the original data, and then use itself again to send that representation to a destination.

Discrete Fourierlets are the primary quanta of the system. The data encoding method chosen will always act upon a particular Discrete Fourierlet, no matter what the encoding method is. Any of the properties of the fourierlet can be exploited to encode data.

Discrete Fourierlets can be used to drive transmit and receive hardware directly, like for TV and Radio stations, wires, cables, whatever, assuming the presence here of any required amplifiers, repeaters, or whatever the system may require to carry the signal correctly.

the bit rate is dependent solely on these systemic resolutions:
oversampling
expansion and compression
dynamic range
magnitude a limit defined: as long as any contained spectral energy can be identified, we can keep reducing the size of the information to its smallest reproducible limit.

SEI is both an energy technique as well as a periodic technique, and can be a multirate system.

there are very few hardware requirements to implement Discrete Fourierlets, and in general, Discrete Fourierlets can be used on top of existing technology. This means, for example, that neither the big telephone companies nor the consumer has to pay for major infrastructure upgrades to make use of a Discrete Fourierlets system. If there is any kind of connection possible using existing technology, Discrete Fourierlets can drive it.

frequency drift that can occur sporadically has no effect on Discrete Fourierlets. It can be said that because of the nature of its abstraction, Discrete Fourierlets are frequency-drift proof.

a signal can be even be encrypted before its input into a system for secure communications, or compressed using Discrete Fourierlets for compression at input to the system.

IV. Spectral Optimization

Single Spectrum

Figure 19:
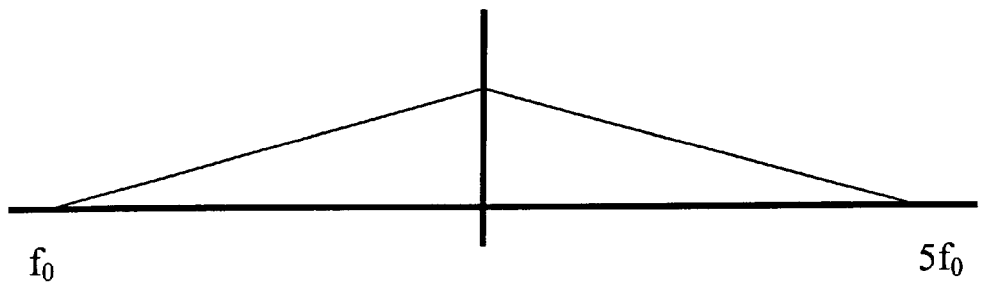
FIG. 19 illustrates a spectrum used in a FSS implementation.

As shown in FIG. 19, here we are using the entire spectrum from $f_0$ to $f_{50}$, all at once. What will happen is that since we are mainly concerned with the amplitude of the fundamental frequency $f_0$ in order to use a single pass through the Fourierlet Shape Shifter, we end up having encoded the fundamental and all its harmonics to a amplitude that is held constant for the entire packet period. This wastes a valuable amount of information-bearing oscillations that the harmonics could exhibit.

For example, an harmonic at 2 times the fundamental frequency could be modulated twice as much per second, since we are concerned with detecting 360 degrees of any given frequency, and a frequency at four times the fundamental could be modulated four times as much.

Figure 20A:
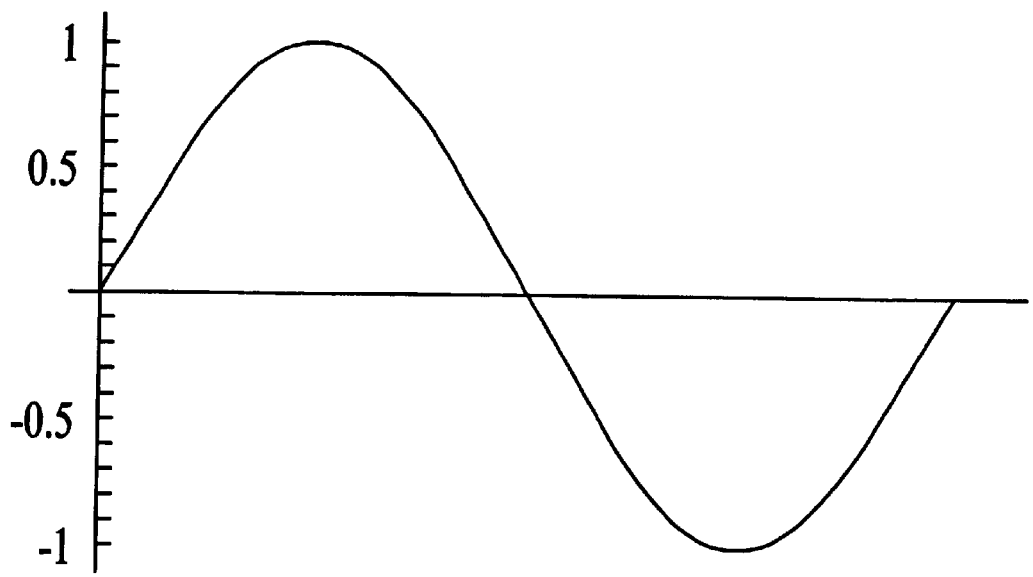
FIGS. 20(a) to 20(c) illustrate the frequency characteristics of two harmonics of a sinusoid.
Figure 20B:
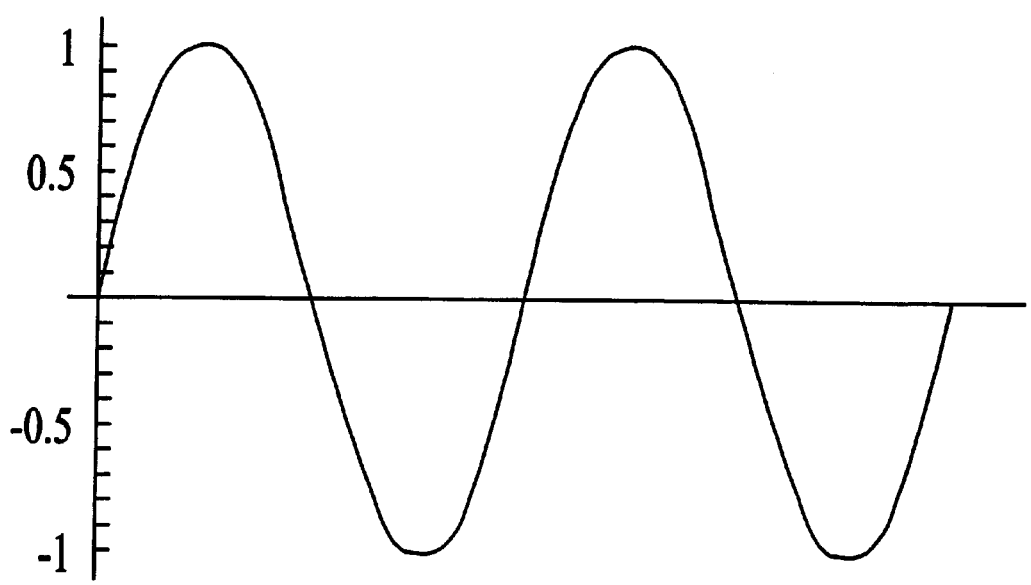
Figure 20C:
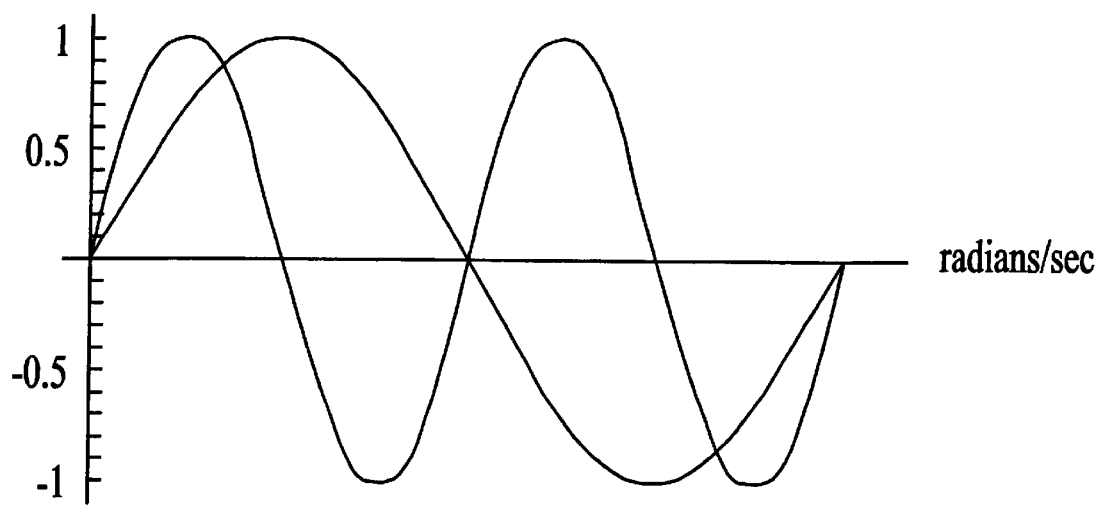
Figure 21:
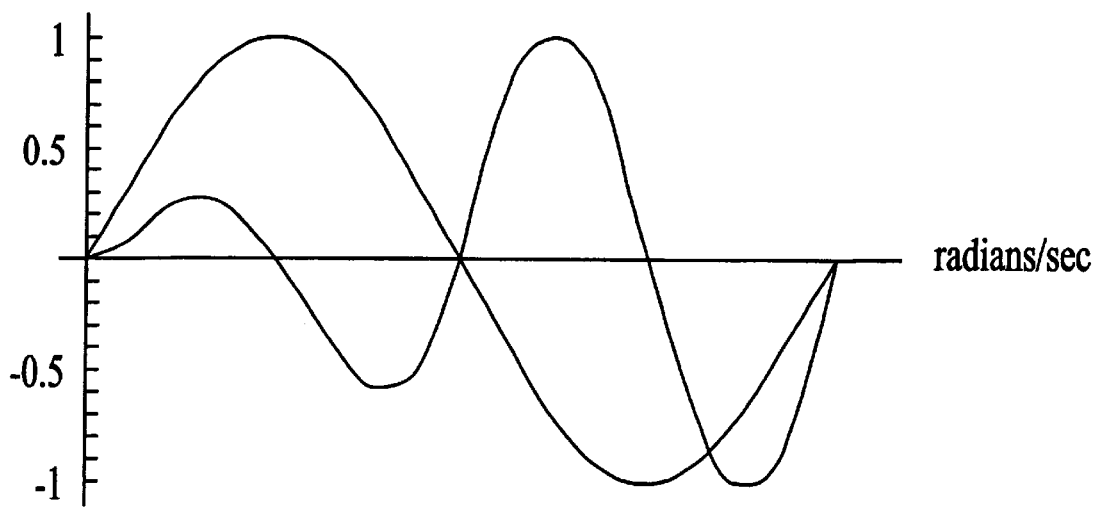
FIG. 21 illustrates a harmonic optimization in accordance with an aspect of the invention.

As shown in FIGS. 20(a) and 20(b), consider the fundamental and an harmonic at twice the frequency. If we view them together, as in FIG. 20(c) it is apparent that the harmonic's second oscillation is in a sense wasted in that it has not been modulated to carry a new value. If we were able to affect the amplitude of the harmonic within the context of 360 degrees of the fundamental, which is also the packet period, the harmonic would carry two different amplitudes within its 720 degrees of travel, thus bearing two pieces of information rather than just one (see FIG. 21).

There is a relationship between the number of Discrete Fourierlets per second, $f_0$, and the number of frequencies used, $f_D$. In some cases, a lower $f_D$ may yield a higher data rate because $f_0$ is smaller, thus increasing the number of Discrete Fourierlets per second. In order to arrive at this ability, two methods are shown in rather simple but not incomplete illustrative terms below. Much of it is arbitrary, and the examples were chosen with simplicity in mind, to show that both work. They should by no means be considered to be the only methods possible of implementation.

Put simply, by dividing the main spectrum into several smaller ones we can take advantage of the various harmonic frequencies. Of course, this increases systemic complexity in that for each sub-spectrum used, there must be a corresponding Frequency Cloud and timing support. Also, in such a system, a coordinated heterodyning operation must occur before the fully constructed signal is ready for output from the system.

The first technique is more simple than the second, although the complexity of implementing either is very similar. The first tries to find the "mother lode" sub-spectrum first, and then uses the rest of the main spectrum as an afterthought. The second break the main spectrum into smaller ones by taking the harmonics into account, attempting to utilize as much frequency oscillation within less than 720 degrees from any given reference point as possible, of any given frequency.

"Main Lobe" Spectral Division Optimization

Figure 22:
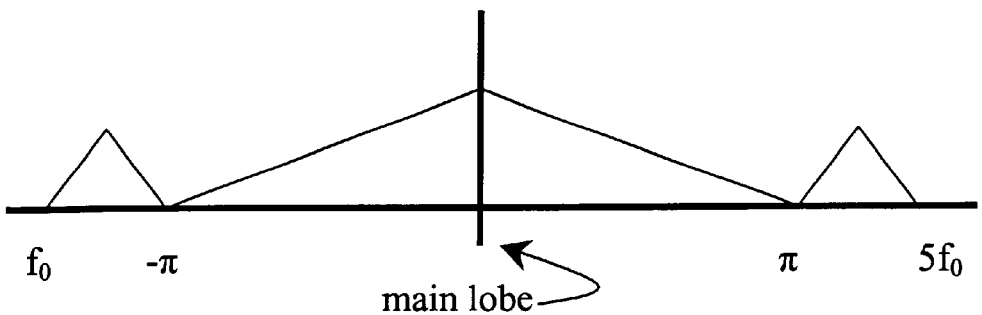
FIG. 22 illustrates a main lobe optimization in accordance with an aspect of the invention.

As illustrated in FIG. 22, the notion of a "main lobe" provides a reference point for us to start with trying to achieve a better ratio of Discrete Fourierlets-per-second versus the range of $f_D$. Using this method, we first halve the main spectrum in order to find the optimal ratio, and then use the 'outer' spectra as left-overs, still capable of bearing information, albeit not in as optimal form.

Consider a spectrum whose $f_o$ is 1 kHz, and $f_n$ is 5 kHz, with an $f_D$ of 2000 frequencies. The maximum a single-spectrum approach would yield is $f_o \, f_D$ Discrete Fourierlets per second, yielding 2,000,000 pieces of information per second. If we were to instead use several sub-spectra starting with the "main" spectrum occupying 2.5 kHz from 1.25 kHz to 3.75 kHz, and the other spectra merely taking up the rest of the space at both ends of the spectrum, the total data rate would yield, if $f_D$ is 1,000 frequencies for $S_1$, and 256 for $S_2$ and $S_3$

| | | |
|---|---|---|
| $S_1$ | $2,500 \times 1,000$ | $= 2,500,000$ |
| $S_2$ | $1,000 \times 256$ | $= 256,000$ |
| $S_3$ | $3,750 \times 256$ | $= 1,024,000$ |
| | | $= 3,780,000$ total data rate per second | which is ~1.89 times the systemic throughput over the single-spectrum approach.

"Fundamental and Harmonic" Spectral Division Optimization

Figure 23:
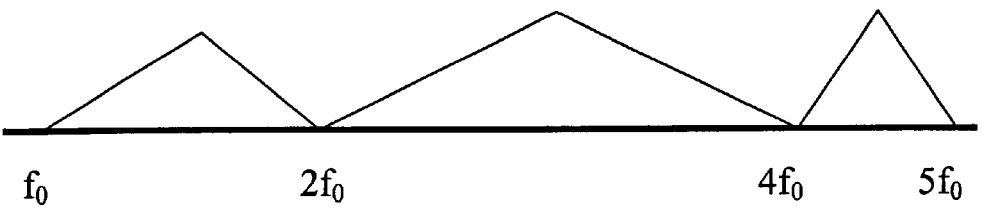
FIG. 23 illustrates another spectral optimization technique in accordance with the invention.

As illustrated in FIG. 23, another method takes the view that frequencies can be exploited better based on their position within a relationship to the fundamental frequency $f_o$ and its harmonics. We divide the main spectrum into smaller ones by starting with $f_o$ and then using up to $2f_o$ so that within a 720 degree travel of the highest harmonic within that sub-spectrum there never occurs a full 720 degree oscillation, which is clearly on a 360 degree boundary in the time domain, and thus have not lost an opportunity to modulate that frequency's amplitude twice.

Another aspect of this method is that the fundamental "slides" as a reference point for the various sub-spectra. It does this by starting with the original $f_D$, and then sliding to $2f_D$, and so on, until the entire "main spectrum" has been "harmonically" divided.

Given the example used above,

| | | |
|---|---|---|
| $S_1$ | $1,000 \times 512$ | $= 512,000$ |
| $S_2$ | $2,000 \times 1,000$ | $= 2,000,000$ |
| $S_3$ | $4,000 \times 512$ | $= 2,048,000$ |
| | | $= 4,560,000$ total data rate per second |

This represents a total increase of almost 2.25:1 versus the single spectrum approach, while still, for all intents and purposes, using a spectrum from 1 kHz to 5 kHz.

V. Data Pipe Concept

Figure 24:
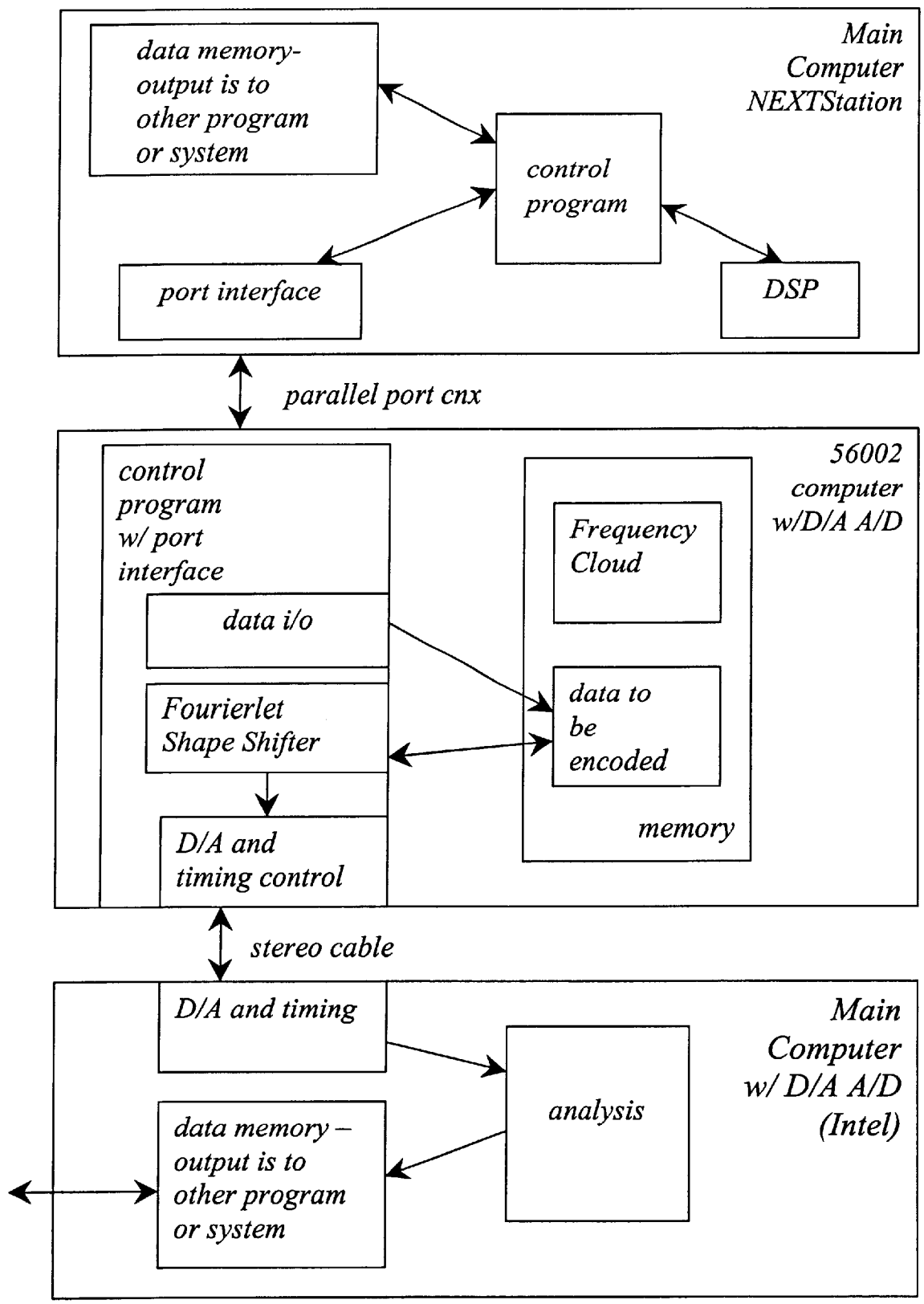
FIG. 24 illustrates a data communication system in accordance with the invention.

The term "data pipe" is used to signify in very general terms that data can be transmitted over various media with various transmission and receiving methods and devices. A transmitting end and a receiving end with this media therebetween constitutes a data pipe. To illustrate a working system in which particular aspects of Discrete Fourierlets can be demonstrated, a data pipe, in particular, a LAN application that can achieve very high data rates by using two channels over a twisted pair cable and 48 kHz 16 bit A/D and D/A converters and a dynamic range of 20 to 20,000 Hz, will be described hereinbelow with reference to FIG. 24.

It should be noted that the SEI method is an abstract method that states in simple, general terms how information can be represented, physically, as localized spectral-member phenomena, and that Discrete Fourierlets is only one way to achieve the SEI generalism.

The test system is made up of several components a NeXTStation computer that has a Motorola 56001 DSP chip on the motherboard, complete with all interface software a Motorola 56002 computer with a 48 kHz 16 bit A/D and D/A pair.

an Intel-based computer running OpenStep 4.1 and DOS.

a parallel port cable for the eval board a 20 foot stereo mini-plug cable, such as that usually used for consumer audio a Discrete Fourierlets kernel implemented in Motorola 56 k assembler running on both the NeXTStation and the Intel machines.

special interface software on the Intel written in C++ to drive certain parallel cable pins software tools to build and maintain the Frequency Cloud special 56 k assembler macro library, including memory arbitration, and interrupt service routine macros.

a DOS hosted Motorola 56002 assembler and debugger for the 56002 computer a NeXTStation (UNIX) based assembler and graphical debugger for the 56001 a 'built' Frequency Cloud that consists of a dynamic range of 2 kHz, having been been made from a Pink noise generator that has been low-and-highpass filtered to allow a bandpass of 2 kHz starting at 1 kHz to simulate the range of a typical phone line, just for the heck of it.

PCM key sequences that will look like very short periodic pulses.

The Intel box is connected to the 56002 computer via its parallel port and drives certain pins to be able to send and receive bytes to and from the computer. A DOS program drives the pins at the Intel side, and the 56002 drives the pins from a 'general purpose I/O' register. The Discrete Fourierlets kernel takes care of all I/0 to and from the Intel box, and contains the Frequency Cloud and so on.

The data to be sent is downloaded from the DOS program to the eval, the eval takes the data and encodes it within a spectrum. It then takes the fourierlet, transforms it into a time-domain signal, and then sends it to the receiver.

In order to frame each fourierlet in time, a PCM key sequence is sent to the receiver to indicate when it can expect to begin interpreting the sample frames it gets from its codec as actual fourierlet data. When it has received the fourierlet it sends back a PCM key sequence that acknowledges receipt with a checksum.

Although a tuning algorithm could be implemented in this scheme, it is not needed when working with a known set of parameters, and the issues are reduced to the exact time signaling, fourierlet framing, and transceiving of data.

Also, the data can be contained in a DOS file that is opened by the sending program, read into local memory, and sent to the eval via the parallel port. Further, the assembler can be used to place the data file directly into the binary image of the kernel to simplify the system and allow work on the Discrete Fourierlets transceiving only.

The kernel double-buffers its input and output so that the reception of data as well as the transmission of the time domain signal are asynchronous, allowing for an optimal architecture within the kernel; this is so because the 56 k processor can be thought of as multitasking when one uses interrupt routines and semaphores to control what happens when, while running a main program loop. This is basically just realtime processing, since we have to know about interrupt latency and other aspects that may be unpredictable.

The NeXT is preferable because of the fact that most of the 56002 kernel code will run on its internal 56001, and the entire interface to the OS is part of the software development kit; it is very stable. Also, the graphical front end running on OpenStep 4.1 is a great visual aid. But in general, the NeXT is just a ready-to-go fully integrated machine with a compatible DSP chip as part of the motherboard. All the routines to do DMA, etc., are in place and debugged by NeXT.

Figure 25:
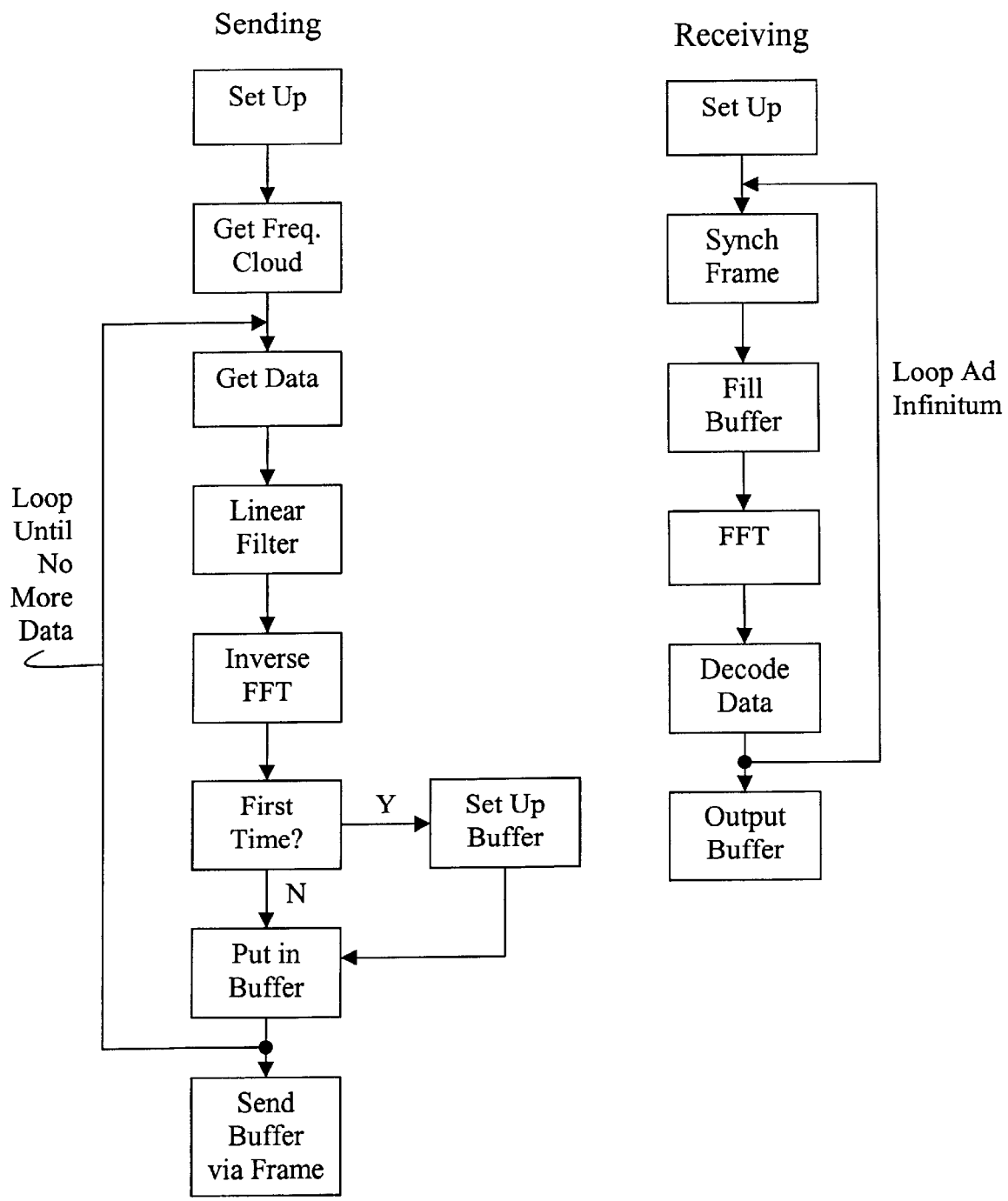
FIG. 25 illustrates a flowchart of the steps performed in the data communication system illustrated in FIG. 24.

How data is moved through the system, in pseudo-code terminology is described hereinbelow with reference to FIG. 25. The buffer sizes in this case have been hardcoded to be 1024 bytes in size.

(1) setup:
  connect the parallel cable to the Intel box and to the eval
  connect the long stereo cable to the audio inputs of the NeXTStation
  power up the eval, Intel box, and NeXT (2) 56002 kernel sending side:
  start up the computer
  get the Frequency Cloud to use and keep it in local memory
  get the data to be encoded
  put it in memory, in this case X memory (the 56002 has 3 memory spaces: X, Y, and P)
  hand it off to the Fourierlet Shape Shifter which performs the linear filter and puts the time domain digital signal in buffer via Inverse FFT. The sine and cosine tables are kept in the beginning of X memory
  if this is the first time a fourierlet is being sent, enable a timer that will interrupt at the rate that the D/A expects sample frames
  if not the first time, just leave the buffer as it is (at a specific address) and do it all again, having specified that the other buffer used for output is to be used.
  the timer interrupt service routine chews through the buffer it knows it must consume (via systemic register flag/semaphore) by taking two bytes and giving it to the D/A, goes to sleep, wakes up, puts the next sample in the D/A register, and continues on until there is nothing to send. Each time this routine is at the beginning of a new buffer it sends a PCM key sequence out the D/A that signals the start of a frame.
  the main routine will not send a PCM key sequence to specify the end of transmission since that is implicit. Only when something is going to be sent does that need to happen
  loop ad infinitum to allow for statistic collection of system parameters (3) NeXTStation 56001 kernel receiving side (also double buffered):
  power up
  connect to the graphical program
  the buffer flip flop semaphore etc. are all set to defaults
  start listening on the line by polling the sample frames from the A/D via periodically active timer-based interrupt routine
  main program waits until the 'frame synch' PCM key sequence is detected. This is done by getting samples and looking at each one. If there are 25 255's in a row, then this is considered a 'beginning of the fourierlet' signal.
  loop until a PCM key sequence is detected
  if a sequence is detected, in this case it will be the frame synch
  start getting sample frames from the D/A and put them in X memory, which buffer depends on the semaphore that is current set the ok to work on current buffer semaphore when the buffer is full flip the buffer indicator and start over again, let the main program take care of the arbitration of when to send the data to its destination main program wakes up performs a 1024-point FFT calculate the magnitude (and phase angle) of each component take the results and place them in another buffer that will be sent to its destination start another interrupt that will consume the buffer by placing the bytes on a DMA stream to the NeXT-Station main processor program. Again, the interrupt service routine will know which buffer to work on by checking the systemic semaphore register.

do it all again, but wait until notified that another buffer is ready from the inputs the program displays the graphic and updates its current system throughput statistics and waits for more data this also continues ad infinitum The various routines can be viewed as finite state machines (FSM), which is much simpler to remember and design. Each FSM acts upon another by using the systemic semaphores. Each FSM is in this case always awake and looking at what state it is supposed to be in.

The FSMs that comprise the application described above are sender
- data producer (get data to send)
- data consumer (send out D/A)
- main program (invoke the Fourierlet Shape Shifter, etc.)

receiver
- data producer
- main program
- data consumer

These should be implemented allowing for optimal real-time use.

VI. Compression Concept

The data encoding techniques of the invention in a compression application will now be described in detail with. Although the aforementioned Discrete Fourierlets implementation is preferably used in this application, it should be noted that other implementations of SEI can be used as well.

Figure 26:
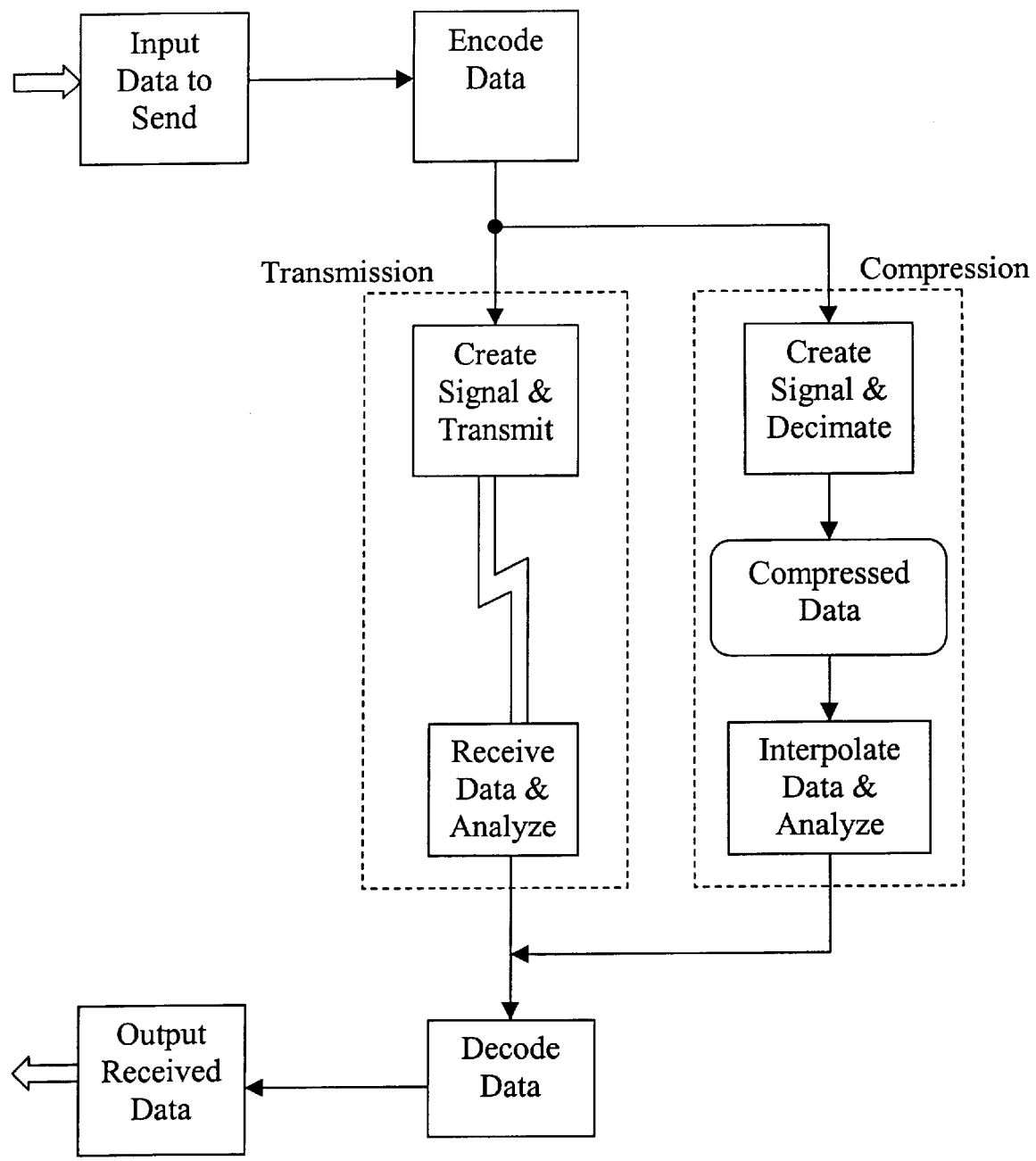
FIG. 26 compares data communication and compression systems employing the encoding principles of the invention.

A top-level diagram of this implementation in comparison with the data communication application is shown in FIG. 26. Some notable differences include:

(1) There is no actual transmission of the encoded signal; rather, it is compressed and stored without transmission over a carrier.

(2) The actual spectrum used to encode the signal is a small part of a larger one, whereas in the communication application, an entire spectrum is preferably used and chosen on the basis of an optimization of the intended carrier.

(3) Since there is no actual transmission of the signal, all filters and other DSP operations can be considered to be ideal; that is, their error rates become ideal, and as such, offer a great deal of reliability.

(4) The simulation of the virtual signal can be made to match any given need.

(5) by using multirate techniques the encoded spectrum is easily manipulated; this is in contrast to transceiver SEI applications, where a particular implementation may not necessarily be a multirate system. By using some recent developments in the area of multirate systems, it is possible to guarantee 100% accuracy within this component of the system. Any SEI implementation can be a multirate system. It is not, however, a requirement that a particular SEI implementation be a multirate system in order to function properly. The way in which Discrete Fourierlets is considered a multirate system is that since the representation of a particular spectrum must be altered, either to reveal spectral detail to the Fast Fourier Transformer, or to achieve compressed representation, the number of samples must be expanded or compressed, depending on the need. This is explained in more detail below.

Figure 27:
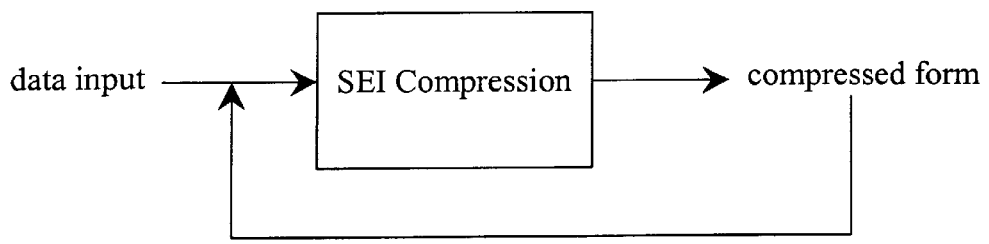
FIG. 27 illustrates how data can be recursively compressed in accordance with an aspect of the invention.

(6) a compression system based on Discrete Fourierlets can be cascaded. As shown in FIG. 27, this means that original data can be compressed via spectral encoding, and then compressed again using the same technique. What the ultimate systemic-cascade threshold is remains to be determined, and is characteristic of a particular SEI compression technique.

Overview of Principles

In order to change the representation of a given, modulated spectrum, we can use well known techniques that are known collectively as Multirate System techniques. Since we are concerned with the compression and expansion of a spectral representation, we can safely borrow from multirate techniques to achieve a lossless transition from compressed to expanded state.

Figure 28:
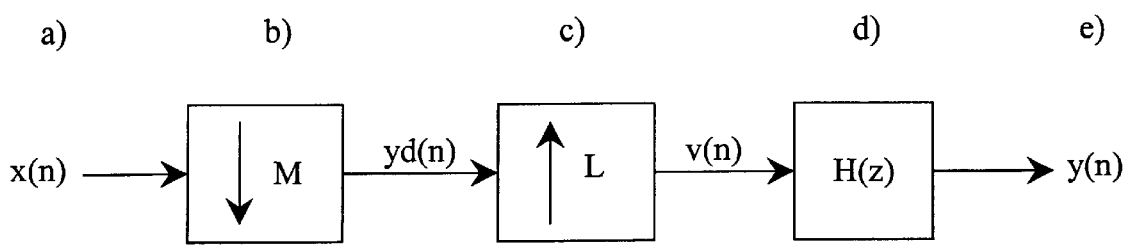
FIG. 28 illustrates the transformation of data in a compression scheme according to an aspect of the invention.

Consider in FIG. 28 where a) is the input b) is the M-fold compressor yielding yd(n)

c) is an L-fold expander, yielding v(n)

d) is the interpolation filter, giving the e) original x(n) as y(n)

The interpolation filter is a lowpass filter that eliminates the aliased spectral images caused by the expander, and follows the expander. For the compressor the order is reversed, first bandlimiting, and then compressing. In both cases the expander and compressor creates unwanted spectral images that must be removed to arrive at the original spectrum, and the decimation and interpolation filters remove this aliasing.

Recovering a bandlimited signal from its compressed version without aliasing can be accomplished by the following steps. Note that if the lowpass filter in d) is not mandatory, in the case where a strictly bandlimited signal is used. The compressor and expander is a linear, but time-varying, system (LTV).

Figure 29:
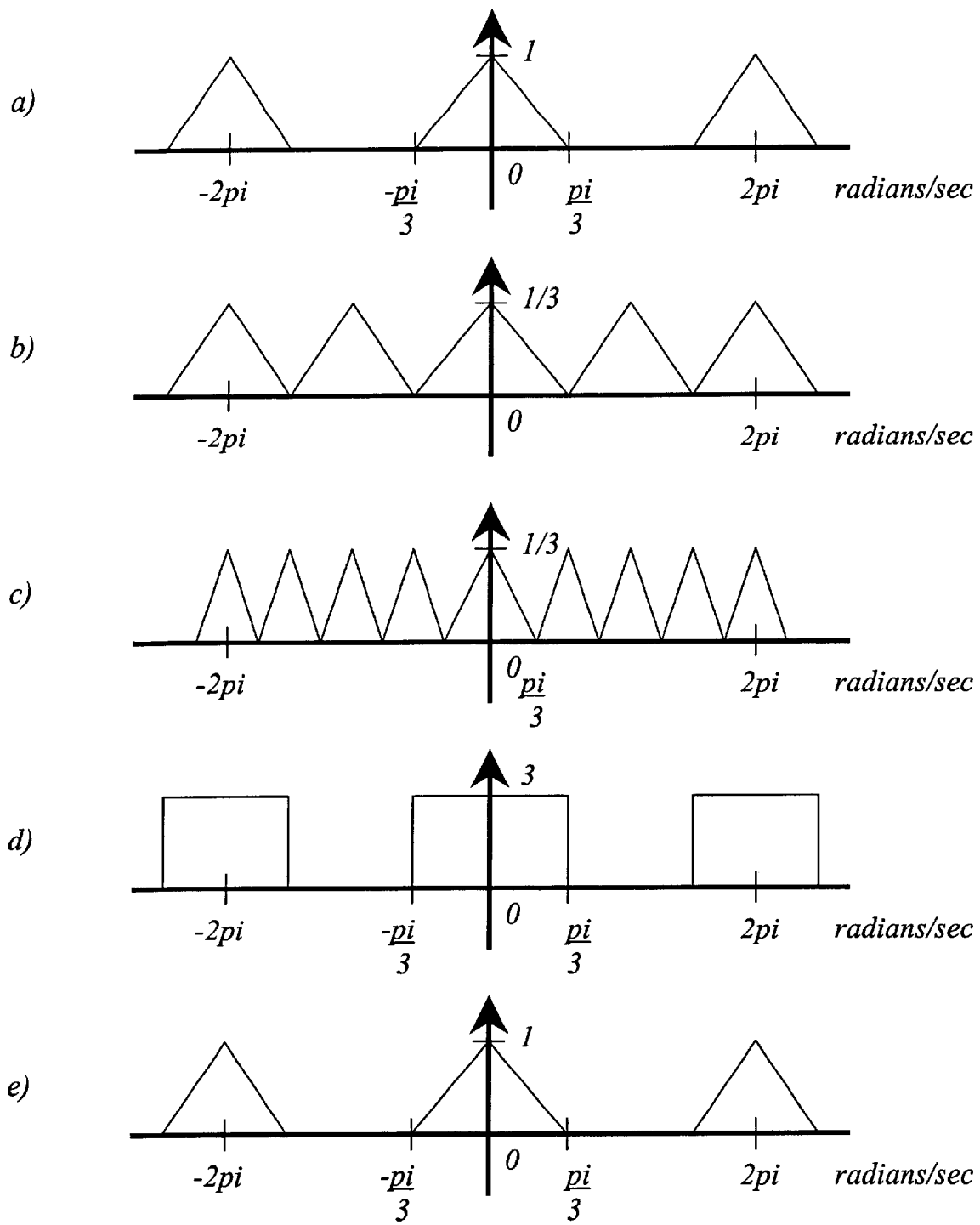
FIG. 29 is a frequency domain illustration of the transformation illustrated in FIG. 28.

The example given above is shown in FIG. 29 in terms of frequency, and a compression of 3:1 and expansion of 3:1 is given. The markers a) to e) are the same as above as well a) is the original spectrum b) is expanded c) is a compressed version of b)

d) is a lowpass filter that eliminates the extra images and extracts the e) original spectrum Another technique that helps prevent aliasing is cascading the expansion and compression stages by two or power-of-two. For example, if a 64:1 compression ratio is desired, one method is to compress first to 2:1, then 32:1. Or, using the power-of-two method, 2:1 compression is performed 6 times. This results in more stable system, and is exactly the same for the expansion of a signal.

Implementation of Compression Process

Figure 30:
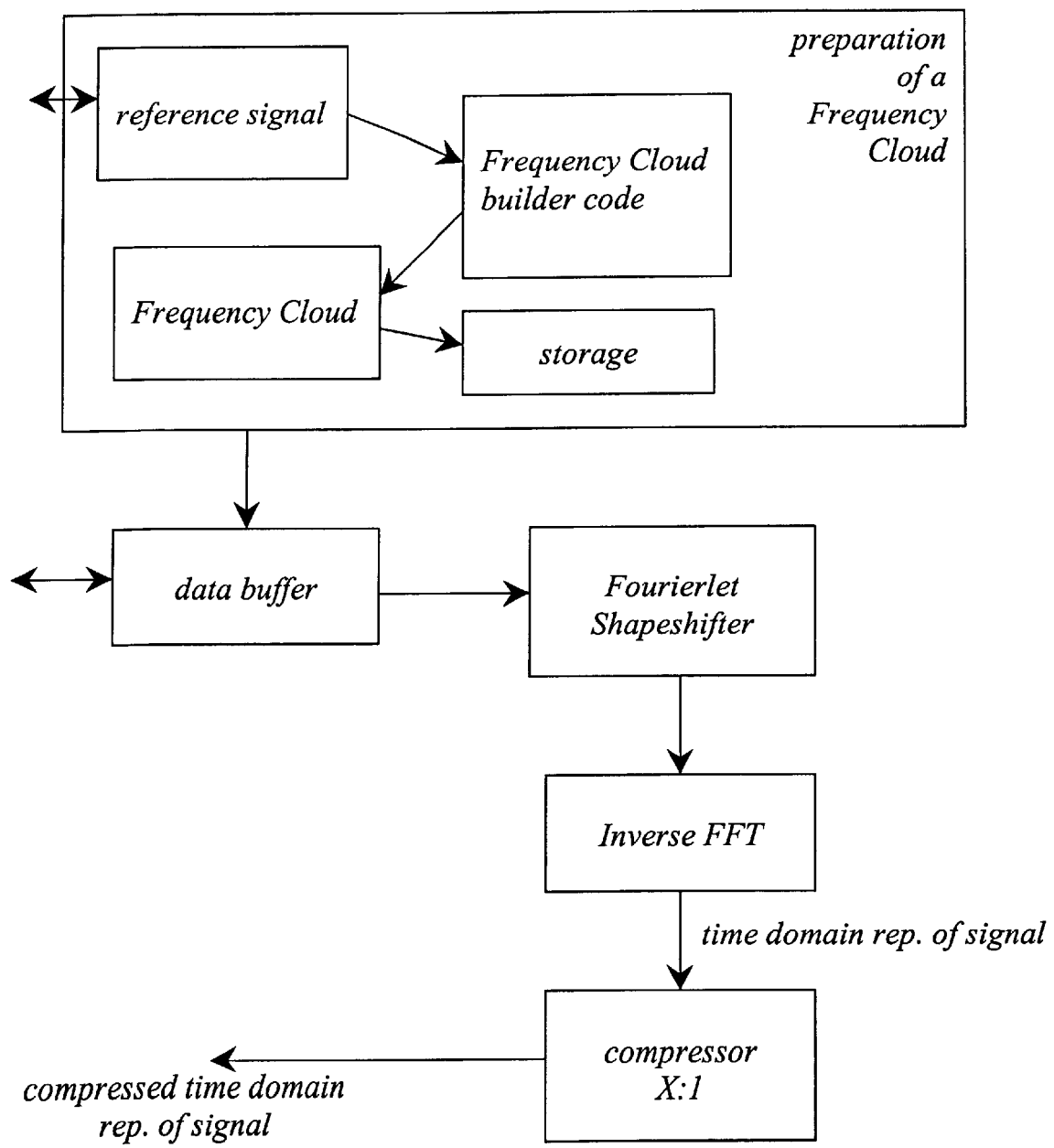
FIG. 30 is a block diagram of a data compression scheme utilizing encoding aspects of the present invention.

The decimation or compression process will now be described with reference to FIG. 30.

(1) Determine the optimum spectrum to use.

Since the compressed data might be required to travel across an actual carrier, the size of the compressed data is preferably matched to the optimal size of a transmission buffer used in transmission hardware For example, if a file is compressed from 80K to 8K, that would take a typical 28.8 k Modem about four seconds or so to transmit. Although the total throughput in those four seconds is 80K, a four second time commitment is required. Such time commitments are important, especially when considering one would have to commit 60 seconds to transmit a 1 MB segment of data. Accordingly, the optimal compression should be selected according to the circumstances.

The spectrum used for the Frequency Cloud will reflect the situation for which it is being used. For example, the Frequency Cloud can be a real world signal defined in terms of a digital signal, and can be generated on the fly by a software object. For example, the Frequency Cloud can be a representation of white noise in the desired frequency range with the desired spectral resolution. Alternatively, the Frequency Cloud can be a simple sum of discrete sinusoids in a given range. In almost all cases, the actual spectrum used will be a small part of a larger one; this situation yields the beneficial aspect that allows for decimation of the representation of the spectrum.

(2) Build the Frequency Cloud

This can be done by performing a Fourier transform on the desired reference spectrum (for example, the band-limited white noise signal, or a single sine wave generated to at least the fundamental frequency $P_A$, being 2 pi radians).

(3) Get the data to be compressed

This may be done merely by getting a pointer to a buffer where data to compressed is stored.

(4) Use the Fourierlet Shape Shifter to encode the data into the spectrum

This can be done with the linear filter algorithm set forth in the description of the communication application.

(5) Return the signal to the time domain.

This can be done by performing an Inverse-FFT on the encoded data spectrum.

(6) Compress the signal

Preferably, the decimation should be performed at least at the Nyquist rate of the highest frequency in the reference spectrum. The decimation step can be performed on a packet by packet basis, or when the entire data sequence is encoded. For example, to compress a binary file on a computer drive, the entire should be encoded and then decimated all at once. However, in a real time system dealing with a stream of data, it may be more preferable to decmate a packet at a time in sequence with any other stream activity. When the compression implementation is embodied as a piece of firmware or software, it should be able to handle both methods to yield the most flexibility.

The decimation process is better termed "compression", since it will compress the representation of the spectrum. The current implementation is as a real multirate system, where compression takes place either to the closest power of two, or via fractional compression. This simply depends on which methods yields the best results. The compressor may be cascaded or not, meaning that there are several choices of how to compress, for example, 50 to 1; or 2:1, then 25:1; or 2:1 up until the nearest power-of-two.

Figure 31:
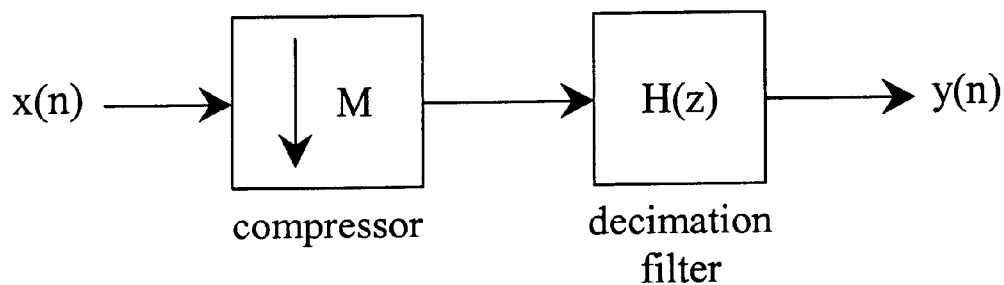
FIG. 31 illustrates data transformation in the data compression scheme of FIG. 30.

As a real computer program, in whatever form (firmware, driver, user-level application), such a program may have to be implemented in a way that allows for its use in as many contexts as possible. Basically, however, consider input x(n) with an M-fold decimation, a decimation filter H(z), and an output y(n), as shown in FIG. 31.

Implementation of Expansion Process

Figure 32:
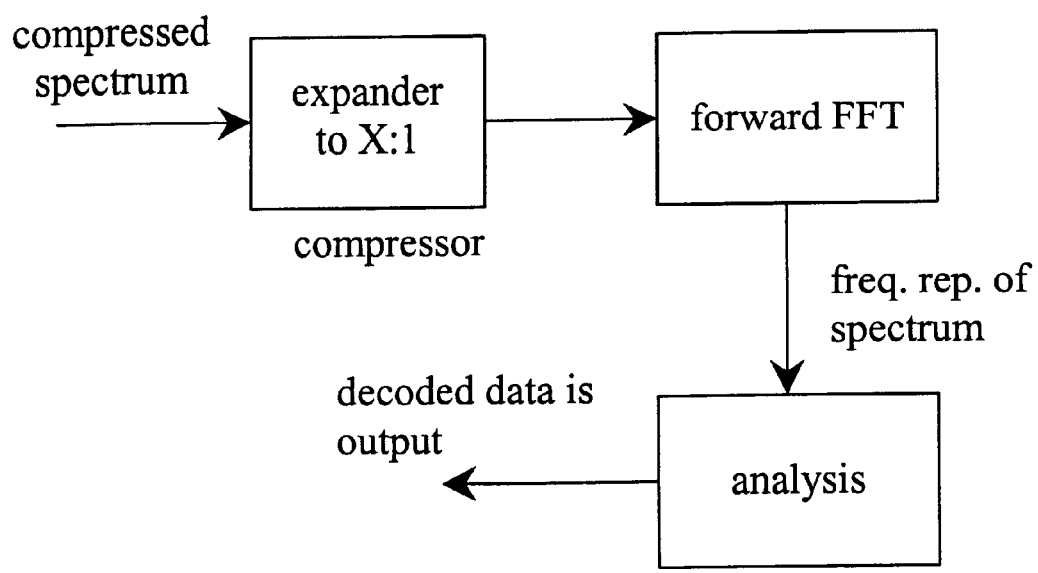
FIG. 32 is a block diagram of a data expansion scheme utilizing decoding aspects of the present invention.

The interpolation or de-compressing process will now be described with reference to FIG. 32.

(1) Expand the compressed data

This is preferably done using FFT interpolation where the Frequency Cloud has been encoded using a Fourier transform. Also, since the filter is accurate up to the Nyquist rate, no frequency loss will occur. It should be noted that the spectral details of the signal can be ascertained by the FFT, and is, in fact, a characteristic of the FFT. In other words, if 128 data points are to be analyzed, only 128 degrees of freedom can be gained. If 1024 degrees of freedom are desired, the signal should be "smoothed" so that it contains 1024 points, which still represent the original 128 points unchanged. It should also be noted that the term "decimation" and "interpolation" are used only to facilitate an understanding of how the total spectrum of a Frequency Cloud is reduced to its known minimal component.

Figure 33:
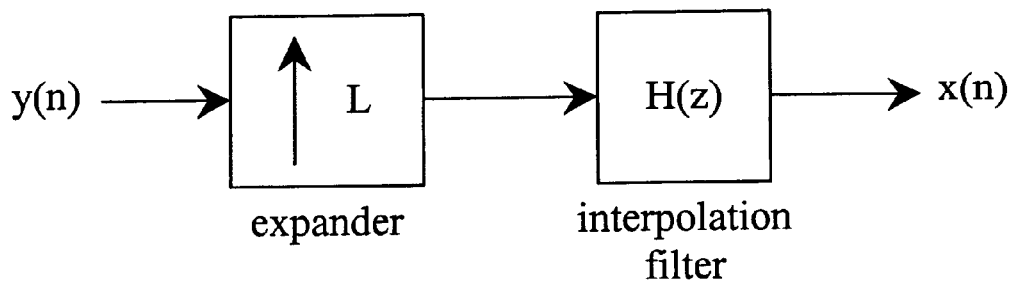
FIG. 33 is a representation of the data transformation in the data expansion scheme of FIG. 32.

In terms of multirate systems, this is easily achievable using the proper compressor and expander filters. "Interpolation" is also really a misnomer, since the spectrum is actually being expanded, but is an accurate term for use in describing the filter H(z) in the example illustrated in FIG. 33, where the input y(n) is expanded via L-fold expansion, and then filtered to remove the extra images via H(z), yielding the original x(n).

(2) Perform an FFT on the interpolated data (3) Filter and analyze each fourier series coefficient Here, the amplitude and/or phase component of each spectral ingredient is extracted, yielding the original data. The decoded data is then sent to an uncompressed file or other storage.

Optimizations use 'real input' FFT routines use of 'two-at-a-time' FFT routines, where two FFTs are computed simultaneously.

This is much faster than performing two FFTs, one after another. This also includes the inverse transforms, in general, the more that can be processed at the same time, the better. So it holds true that in general, multi-dimensional transformers will perform better.

when encoding in the amplitude spectrum only, the use of a Hartley transform is in most cases much faster. A Hartley series may also be transformed into a fourier series, and vice versa.

use of wavelet transforms.

use of Goertzel filter banks to detect and code frequencies as an alternative to using FFTs. In this case, more systemic information must be available, but the result is more precise, not so much of a "shotgun" approach as Discrete Fourierlets.

VII. Other Applications

1. Hard Drives, Audio Tape, Digital Tape Storage (1/4, DAT, etc.), Video Tape (VHS, 1/2, etc.), Floppy/Removable Storage, Any Other Magnetic Storage Medium.

The storage of information, be it analog or digital, is completed by charging metallic particles on a substrate using a recording head. The substrate can be flexible, hard, linear, circular, or of any other shape. Common storage devices that use this basic method are hard drives, audio tape, DAT, video tape, floppy drives, removable media, etc. This section will not describe the physical means of placing a signal on such a substrate, but how the SEI (sonYx Encoding of Information) method can be used to encode digital information of any type onto such media. Specific examples will be stated, however, this method is not limited to these examples alone, but to any recording media that allows such magnetic storage.

Any audible, visual, etc. information can be broken down into a digital representation of this information using some kind of coding device such as a AID converter. Once information is presented in a digital format it can be stored easily. Typically storage of digital information was accomplished by a simple serial data stream to some sort of magnetic storage medium. Rather than recording information (analog or digital in origination, now converted to digital), as a serial data stream, the same information can be stored using the SEI method. When this information is stored using the SEI method, the density, and speed at which it can be retrieved/stored is vastly improved. In many cases, the same media which could only contain a limited range of information can now store a full range of information.

Hard Drive, Floppy Drive, Removable Media, etc. Storage

Figure 34:
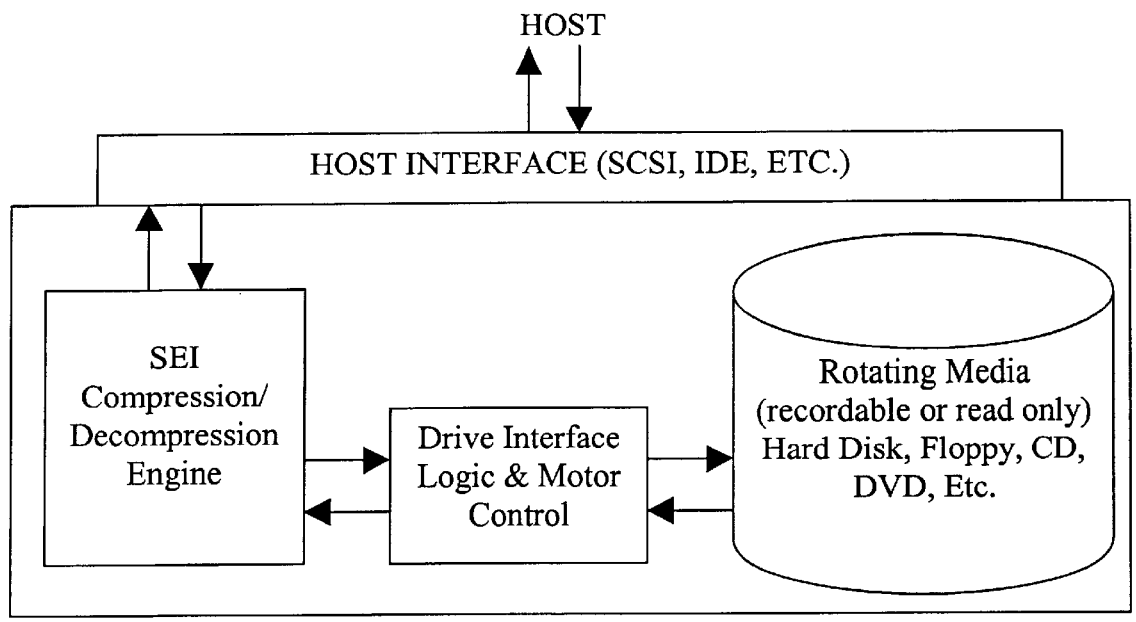
FIG. 34 is a block diagram of a data storage device utilizing aspects of the present invention.

Given a rotating magnetic storage media with a certain analog recording bandwidth, it is possible to encode digital, or analog data, that has been converted to digital, using the SEI method, as illustrated in FIG. 34. Digital data is processed through the algorithm, and converted back to analog information which is recorded on the magnetic media. Throughputs of tens of megabytes per second can be accomplished on a media which could only support 1–2 megabytes throughput. Densities can be increased in relation to the track width, rotational speed and recording electronics which broadens the analog recording bandwidth. The density of the recording is also directly proportional to the bandwidth and horsepower of the SEI encoding hardware.

Video, Audio, DAT, etc. Storage

Figure 35:
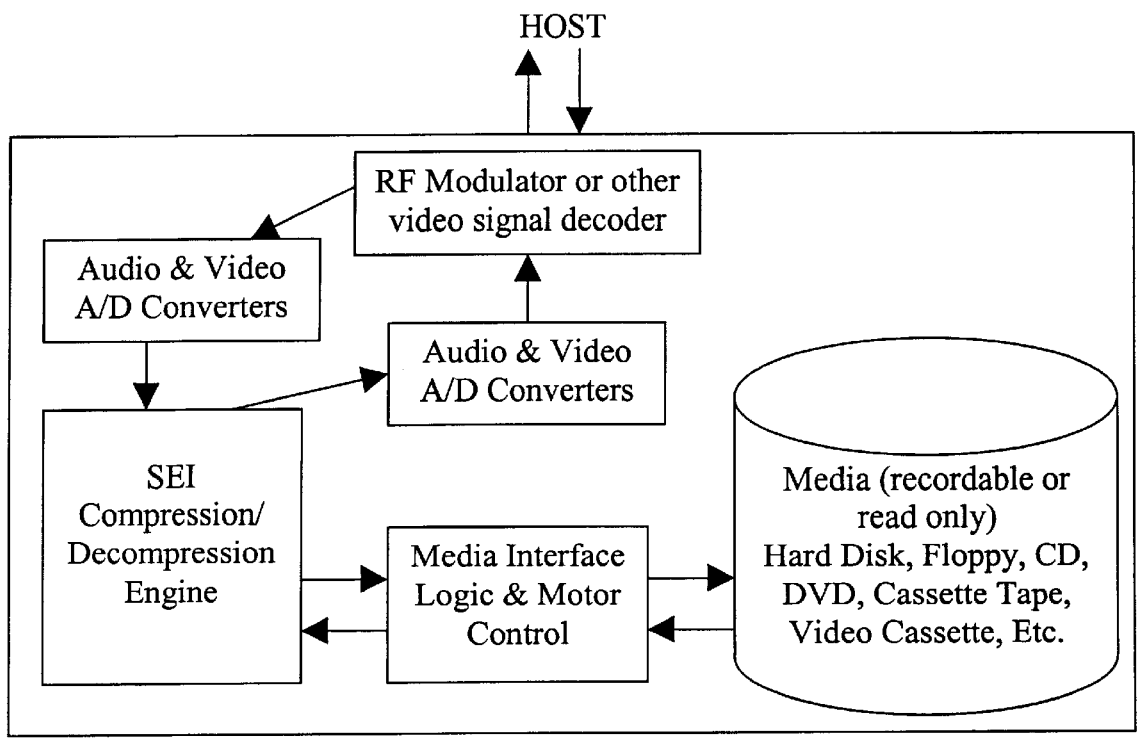
FIG. 35 is a block diagram of audio/video storage utilizing aspects of the present invention.

Given a linear magnetic storage media with a certain analog recording bandwidth, it is possible to encode digital, or analog data, that has been converted to digital, using the SEI method, as illustrated in FIG. 35. Digital data is processed through the algorithm, and converted back to analog information which is recorded on the magnetic media. Throughputs of tens, and hundreds of megabytes per second can be accomplished on a media which could only support analog recording. Densities can be increased in relation to the media width, linear speed, and recording electronics which broadens the analog recording bandwidth. The density of the recording is also directly proportional to the bandwidth and horsepower of the SEI encoding hardware.

2. Transceiver Chip, Point-to-point Communications, Modem, FAX, Computer Architecture, Commercial Broadcasting A General-purpose Transceiver To facilitate use in as many different configurations as possible, a transceiver chip would allow hardware devices that are not capable of performing SEI techniques themselves to make use of Discrete Fourierlets. As a chip, it would be 'plugged in' to whatever architecture is desired. The term 'chip' can also mean a chipset that is usable the same way, but is made up of several chips, and not just one, to support the function. Or, it could be a single, integrated chip. In the general sense, the transceiver is made up of a software finite state machine (SFSM) implementing SEI techniques on the hardware a hardware FSM to support the SFSM The chip would be a single, standalone unit, without the need for other external hardware, other than another chip like it at the other end of the connection. Please keep in mind that devices that employ the transceiver will also all follow the same sequence of events for making connections, etc, since they all use the same component. The single chip itself contains machine code to perform the encoding/decoding, as well as support the I/O of data, signals, and so on.

Figure 36:
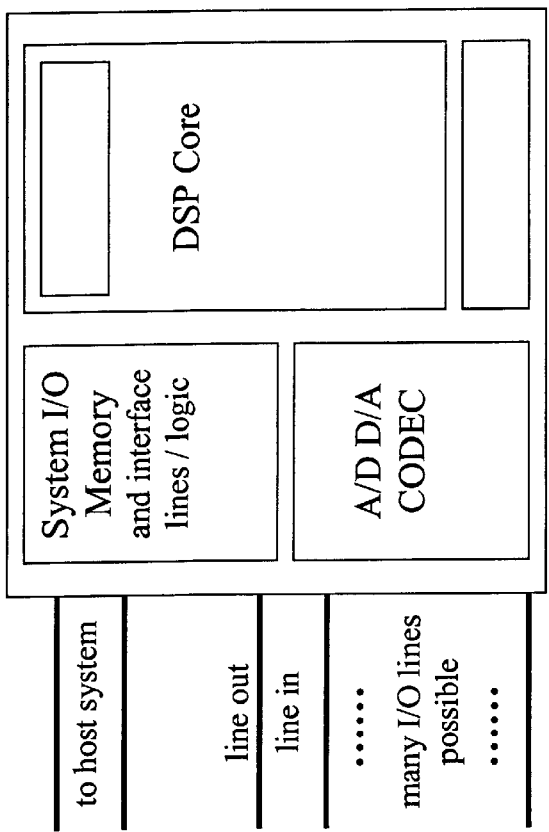
FIG. 36 is a block diagram of a transceiver module in accordance with aspects of the invention.

As shown in FIG. 36, internal to the chip is its own DSP core, a codec or A/D and D/A, and at least two lines, one for input and one for output, both digital and analog, for asynchronous communications. In this configuration, a chip would connect to another via the line out and line in, or in the case of a strictly digital-only channel, via the digital in and out.

The nature of the message signal itself depends entirely on the capabilities of the A/D D/A CODEC section in that it will always have a certain operational capacity that is a result of its physical attributes. It can be a RF, IR, 'wired', or any other media CODEC that supports a particular operating environment and operating bandwidth, from 300 Hz–4 kHz for phone lines, to several GHz for satellite and optical.

Using the transceiver chips allows hardware manufacturers to plug in an entire hardware communications subsystem, external to their system. It can be used as the primary systemic I/O interface, or in any other capacity as needed.

Since the transceiver uses our technique in software, all the niceties that are necessarily performed by Discrete Fourierlets are all included, like 'system tuning' at startup to dynamically determine operational parameters, error correction, and so on. Any device built using either this chip, chipset, or method, will incorporate the entire technique of the Discrete Fourierlets method.

The added benefit is that since it is conceivable that there will be improvements on the transceiver design, and will be able to be made faster and faster with improvements in hardware components, and CODECs will become higher resolution, faster sample rates, etc., that by using the 'adaptive control parameter' determination technique, this will allow 'older' transceivers to connect with newer ones, thus preserving the usability of a device despite improvements and upgrades. Even if a newer transceiver uses a completely different 'line out' (for example, a VHF satellite connection), a bridge between the two different physical media is possible.

Also as part of the tuning process, the transceiver is able to act in concert with other transceivers by cooperatively determining what bandwidth is to be used by each individual transceiver. This allows for single-channel multi-transceiver multidrop configurations.

As a single chip, the transceiver footprint can be quite small.

What follows is a description of some useful devices that use either the transceiver chip, or the Discrete Fourierlets software alone.

Radio and TV Broadcasting Applications

Figure 37:
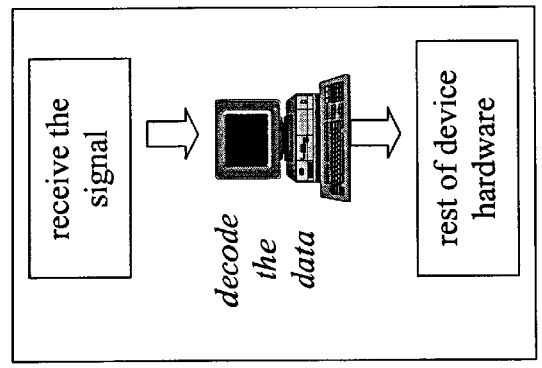
FIG. 37 illustrates the use of the aspects of the invention in a broadcast scheme.
Figure 37:
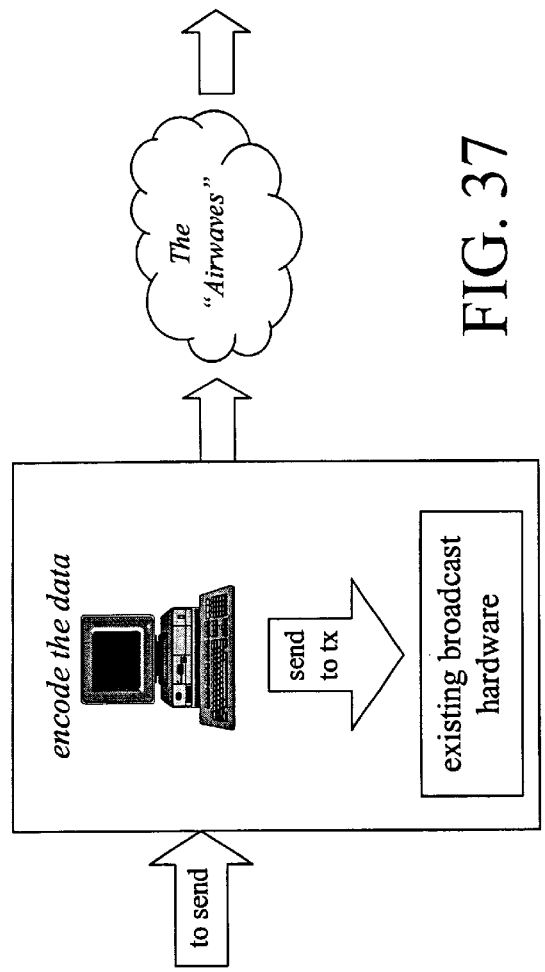

As illustrated in FIG. 37, it is possible to use existing broadcasting systems to transmit much higher quality images and sound. Using the principles of the present invention, a station equipped with such hardware will be able to transmit on exactly the same base frequencies and bandwidths; but they will be able to transmit much more information. For example, within a 11 kHz bandwidth, using SEI techniques, it easily possible to transmit 160 kbytes per second, which is more than enough than the bit rate needed to transmit 2 channels of CD-quality audio. Another good example would be for High Definition TV (HDTV) signals to travel over a 'meta bandwidth' that is actually a currently-standard TV signal.

The point is that by using existing infrastructures, one can vastly increase the amount of information transmitted.

What is required is that a broadcaster will need SEI hardware to encode the information, and can then use their existing hardware to transmit it. On the receiving side, an SEI transceiver (hard or software) handles the incoming signal right after the receiver hardware gets a hold of it, and then passes it along to the rest of the process.

Point-to-Point Communications Devices: Any Modem (Phone Line, Cable, etc.), LAN, Satellite, Wireless Modem Very high bit rates can be exploited over standard phone lines without additional equipment. The transceiver is coupled with a telephony chipset to provide dialing and hangup features and a general-purpose chip that coordinates them both. Also possible is the use of the software algorithm by a main CPU and a sound 'card', or other existing programmable DSP hardware. For example, a more 'simple' implementation can consist of a Pentium (trademark of Intel Corp.) system and a SoundBlaster (trademark of . . . ) or other audio/modem card, like SVDs. The Pentium sends data to the card, which is running the encoding/Transmission algorithm, that sends the message signal out its 'line out' to a receiver of any configuration running our algorithm. This works because a Discrete Fourierlets device can connect to any other Discrete Fourierlets device. In other words, this technique can make use of either:

specialized, dedicated hardware, OR off the shelf hardware of several different types Once the phone connection is made, the frequency range and magnitude resolution is determined by both ends of the connection. There are several ways to do this; one is via single-stepped transmission and detection via Goertzel routines; another is to send a PCM key sequence. Another is to use any standard technique available now: QAM, FSK, PSK, etc. This corresponds to the general 'tuning' process, an adaptive, dynamic connection protocol.

Once that has been established, the error correction algorithms are provided with their operational characteristics.

LAN, Satellite, Wireless, Video Conferencing

Not only is it possible now, using this technique, to greatly improve transmission speeds over limited carriers, but it is also possible to enhance any existing data rates, as in current video conferencing techniques.

Using even an analog phone line to implement a video conferencing system could be accomplished by having a computer of some kind, either a full blown PC, or a dedicated piece of hardware that includes either an SEI transceiver such as that illustrated in FIG. 35, or software algorithm running on a DSP chip with all needed supporting hardware, like high speed codecs, etc.

The user dials the phone number to connect to via some keypad, or voice recognition, and the phone line logic would handle the phone line connection, check for busy tones, and so on.

Once a connection is made, both ends 'tune' to each other, agreeing on data rates, bandwidth, and energy propagation parameters. Once each side is tuned to the other, the controlling software accepts input from the attached microphone and video camera, encodes it, and transmits it; this happens how ever many times per second the current connection is tuned to. the frame rate may be 30 fps, or may be 4 fps over noisy, bad quality connections.

The receiving end analyzes the energy content of the spectrum in use, decodes the data, and sends it to the speaker and video display screen.

Note that all this can be accomplished by using either an SEI transceiver or the SEI method implemented on a controller that is powerful enough to perform under the real-time requirements of the needed data rates.

FAX

A standalone FAX machine is made by adding telephony functionality to the HFSM and SFSM, like for the telephone modem, and extending the SFSM to specifically handle FAX protocols. It can talk to existing technology as well as another SEI FAX machine, leveraging integration into existing FAX technology.

The sequence of events:

the main system instructs chip that it now wants to send a fax, having scanned a document and being in a ready to send state.

the chip dials the specified phone number via PSTN line.

at answer, the chip first signals the receiver that it is indeed one of our chips as part of the 'tuning' process.

if the receiver does not acknowledge that it knows SEI, the sender will act as a 'standard' FAX machine.

if the receiver does acknowledge, then the tuning proceeds at the determined speed and resolution, the FAX data is sent using an SEI message signal.

at successful receive, the connection is terminated.

for every transition in state, the user is notified via LCD panel or some other means.

New Computer Hardware Architecture

Figure 38:
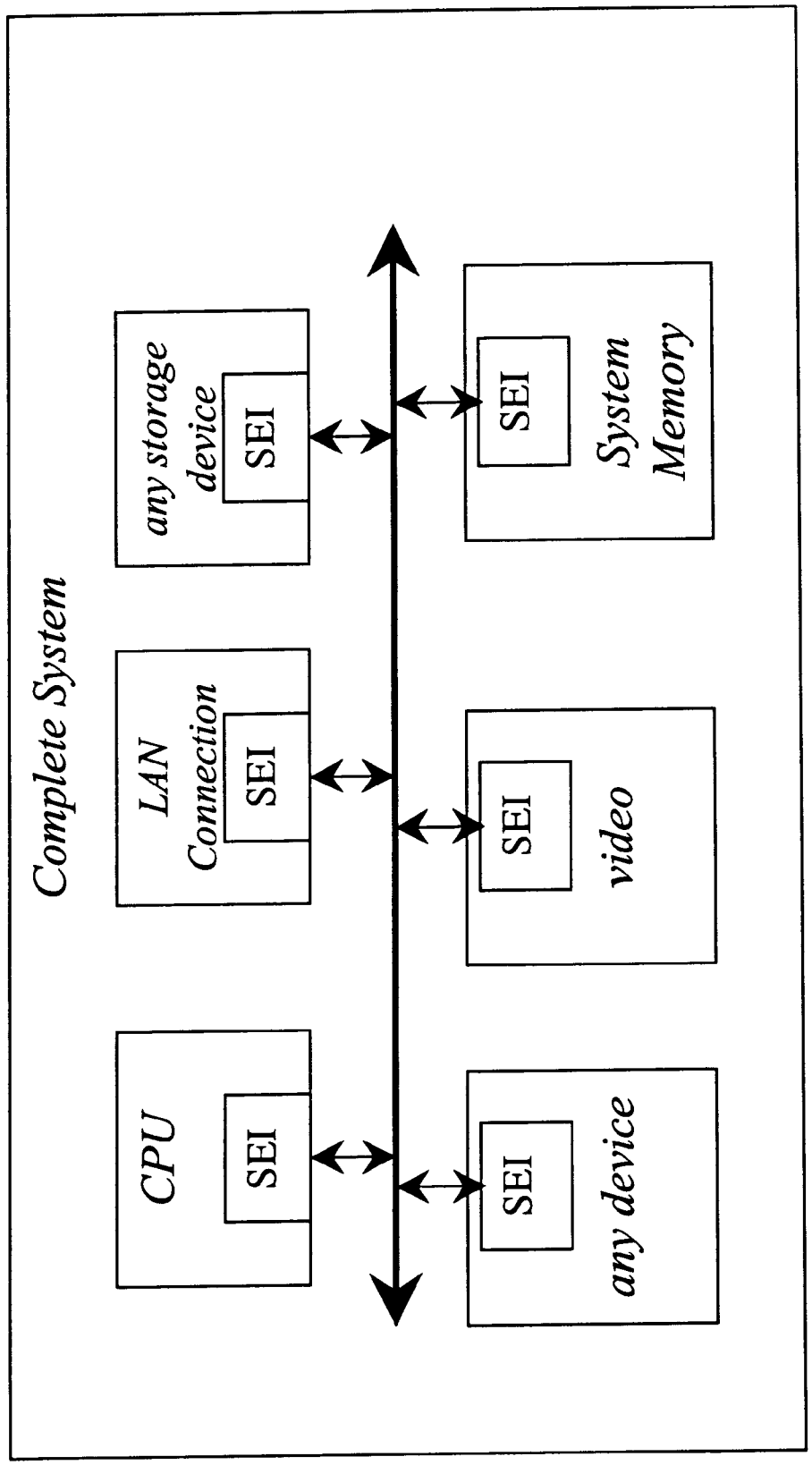
FIG. 38 illustrates a system having a backbone utilizing aspects of the invention.

The technique and chip can also provide a communications backplane for any computer system, replacing or complementing existing bus technology like ISA, EISA, PCI, SCSI, VME, and VLB, as illustrated in FIG. 38. A 'bridge' can even be built so that a non-Discrete Fourierlets peripherals can talk to Discrete Fourierlets peripherals.

By connecting the chip to a multiplexed backbone that is either a multiplexer chip, like a network hub, or a single, asynchronous channel, a system bus is made. A single transceiver can then act as a 'bus master' or as a 'standard' client. A transceiver can broadcast signals, or direct them to a single central receiver, depending on configuration. There can be many hubs per system, each capable of handling N number of devices for which it can direct packet traffic. In addition to using the useful notion of a hub, another helper is the router. Its main function is to reroute traffic according to whatever routing requirements have been placed on it.

What this means in general is that there is no longer any distinction between what is now referred to as a Network and a Computer Bus. All devices that interact with each other make up the network, regardless of function. This kind of a view of the world makes possible totally new architectures and applications. Briefly put, what becomes possible is such extremely fine-grained distribution and sharing where appropriate. To make use of all this functionality, we have developed a protocol, software development kits, runtime kernels, and drivers for existing computer operating systems to create a true homogeneous networking paradigm, called "metaNet.".

To give an example of total throughput for a 16 bit, 100 kHz range system using 20,000 frequencies, with a packet period of 1/10,000 seconds:

$20,000 * 16 * 10,000 \rightarrow 3,200,000,000$ bits per second $\rightarrow 400,000,000$ bytes per second or, just for hypothetical posturing, what about 100,000 freqs. at 32 bits resolution, with a packet period of 1/100,000 seconds:

$100,000 * 32 * 100,000 \rightarrow 3.2^{11}$ Bits per sec $\rightarrow 4^{10}$ bytes per second At system startup, all Discrete Fourierlets devices 'tune' to each other as a matter of protocol. Once the configuration and connections are determined, the system uses standard Discrete Fourierlets techniques to actually transmit and receive data.

Theoretically, any number of Discrete Fourierlets devices may be connected to such a bus; whether or not a particular device is allowed to connect to the bus can be determined via consensus. If a system contains a Discrete Fourierlets device that cannot give up any bandwidth, then the new device cannot be connected. In such a case, the backbone must be upgraded.

This bus architecture is unique in several ways:
- it is very expandable
- is is dynamic in configuration
- it is upgradeable
- it is not necessarily confined to the inside of a computer chassis As for the last point, consider a computing system that is not made up of a 'main chassis' at all. Each element can be located wherever is optimal. This increases the configurability of a system tremendously.

The distance between the devices can be anything within an optimal range, possibly several feet or meters. This allows for a very small system footprint. Connecting a new device is not necessarily a matter of opening the chassis and inserting a peripheral card. The Discrete Fourierlets devices can be totally standalone. Also, depending on the exact type of message signal, the system may not even need to be powered down to make a connection to a new device.

This also gives rise to a new way to share hardware resources. Consider for example a system where there are 5 CPU units all connected to a single video unit that is capable of driving at least 5 displays. Or a single, huge bank of memory that can be used by CPUs, peripheral devices, and printers. In this way, devices become a unit unto themselves, with all the hardware needed to communicate with what they consider the outside world. A good example of this is found in properly designed Object-Oriented systems: each object itself is a finite state machine that also has a clear, easy to understand interface that is used by other objects to 'drive' it.

This notion of 'hostless' devices is a radical departure from the norm of current hardware architectures. Each device is literally on what can be thought of as a 'local network', providing services as to its agreed-upon role in any given system.

Devices can also be connected via any number of bridges or routes. In this way, since the protocol is the same, one computer in Washington, D.C. can directly access (for example) the display device of a colleague in San Jose, Calif. by simply forming a connection to it. What this means is that the remote display device is not just connected to via TCP/IP or some other protocol through software drivers on a host system, the way it would be accomplished using currently employed techniques, but that the display device itself becomes part of what the local system sees as its 'motherboard'.

Consider also a corporate solution where user Raja on the 9th floor has suddenly acquired the need for 30 MB extra memory to run a very complex number-crunch. Instead of having to open the chassis of his computer system and put in more SIMM chips, having separated him or the company from a significant amount of cash, if that is even possible in the first place, he can dynamically request the resource. Assume that Candice on the 3rd floor is just running some word processing program, and no one else on that floor is using their CPUs, and that the 3rd floor has a memory resource of 2 Tera bytes (presumably, this is the floor that the VP of IT has graced with the location of his office, and he likes to play DOOM from 9–5; the sheer size of the memory pool is a demonstration of his power). Through whatever arbitration and/or firewalls, etc., Raja is granted a 100 MB chunk of that memory, from the 3rd floor, which his system sees as local memory, attached directly to his CPU. He is now able to run his genial number-crunch. This is useful for more than just what is mentioned here; totally new and unforeseen applications are possible because of this new architecture.

This kind of a system can be used in

Commercial Broadcasting TV or radio

Automotive computers for system monitoring, diagnostics, etc.

Aeronautics

Business computing

Personal Computing

Entertainment Industry for Video and Audio

Portable Computing

Manufacturing Control and Instrumentation

Embedded Applications (FAX machines, modems for cable, phone line, etc.)

Telecommunications

Internet resources

Supercomputers

We claim:

1. An apparatus for encoding information represented by at least first and second data items, said apparatus comprising:

means for preparing a reference signal complex, said reference signal complex including at least first and second spectral components having first and second frequencies, respectively, said first and second frequencies being different, said first and second spectral components having first and second reference amplitudes, respectively;

means for adjusting said first reference amplitude of said first spectral component of said reference signal complex in accordance with said first data item; and means for adjusting said second reference amplitude of said second spectral component of said reference signal complex in accordance with said second data item.

2. An apparatus as defined in claim 1, further comprising:

means for forming an encoded signal complex including at least said adjusted first and second spectral components.

3. An apparatus as defined in claim 1, wherein said reference signal complex further includes at least third and fourth spectral components having third and fourth frequencies, respectively, said third and fourth frequencies being different, said third and fourth spectral components have first and second reference phase offsets, respectively, said information being further represented by third and fourth data items, said apparatus further comprising:

means for adjusting said first reference phase offset of said third spectral component of said reference signal complex in accordance with said third data item; and means for adjusting said second reference phase offset of said fourth spectral component of said reference signal complex in accordance with said fourth data item.

4. An apparatus as defined in claim 3, wherein said third spectral component and said third frequency are said first spectral component and said first frequency, respectively, and wherein said fourth spectral component and said fourth frequency are said second spectral component and said second frequency, respectively.

5. An apparatus as defined in claim 3, further comprising:
    means for forming an encoded signal complex including at least said adjusted first, second, third and fourth spectral components.

6. An apparatus as defined in claim 2, further comprising:
    means for extracting said adjusted first spectral component from said encoded signal complex;
    means for retrieving said first data item in accordance with said adjusted first reference amplitude of said adjusted first spectral component of said encoded signal complex;
    means for extracting said adjusted second spectral component from said encoded signal complex; and
    means for retrieving said second data item in accordance with said adjusted second reference amplitude of said adjusted second spectral component of said encoded signal complex.

7. An apparatus as defined in claim 5, further comprising:
    means for extracting said adjusted first spectral component from said encoded signal complex;
    means for retrieving said first data item in accordance with said adjusted first reference amplitude of said adjusted first spectral component of said encoded signal complex;
    means for extracting said adjusted second spectral component from said encoded signal complex;
    means for retrieving said second data item in accordance with said adjusted second reference amplitude of said adjusted second spectral component of said encoded signal complex;
    means for extracting said adjusted third spectral component from said encoded signal complex;
    means for retrieving said third data item in accordance with said adjusted first reference phase offset of said adjusted third spectral component of said encoded signal complex;
    means for extracting said adjusted fourth spectral component from said encoded signal complex; and
    means for retrieving said fourth data item in accordance with said adjusted second reference phase offset of said adjusted fourth spectral component of said encoded signal complex.

8. A method for encoding information represented by at least first and second data items, said method including:
    preparing a reference signal complex, said reference signal complex including at least first and second spectral components having first and second frequencies, respectively, said first and second frequencies being different, said first and second spectral components having first and second reference amplitudes, respectively;
    adjusting said first reference amplitude of said first spectral component of said reference signal complex in accordance with said first data item; and
    adjusting said second reference amplitude of said second spectral component of said reference signal complex in accordance with said second data item.

9. A method as defined in claim 8, further comprising:
    forming an encoded signal complex including at least said adjusted first and second spectral components.

10. A method as defined in claim 8, wherein said reference signal complex further includes at least third and fourth spectral components having third and fourth frequencies, respectively, said third and fourth frequencies being different, said third and fourth spectral components have first and second reference phase offsets, respectively, said information being further represented by third and fourth data items, said apparatus further comprising:
    adjusting said first reference phase offset of said third spectral component of said reference signal complex in accordance with said third data item; and
    adjusting said second reference phase offset of said fourth spectral component of said reference signal complex in accordance with said fourth data item.

11. A method as defined in claim 10, wherein said third spectral component and said third frequency are said first spectral component and said first frequency, respectively, and wherein said fourth spectral component and said fourth frequency are said second spectral component and said second frequency, respectively.

12. A method as defined in claim 10, further comprising:
    forming an encoded signal complex including at least said adjusted first, second, third and fourth spectral components.

13. A method as defined in claim 9, further comprising:
    extracting said adjusted first spectral component from said encoded signal complex;
    retrieving said first data item in accordance with said adjusted first reference amplitude of said adjusted first spectral component of said encoded signal complex;
    extracting said adjusted second spectral component from said encoded signal complex; and
    retrieving said second data item in accordance with said adjusted second reference amplitude of said adjusted second spectral component of said encoded signal complex.

14. A method as defined in claim 12, further comprising:
    extracting said adjusted first spectral component from said encoded signal complex;
    retrieving said first data item in accordance with said adjusted first reference amplitude of said adjusted first spectral component of said encoded signal complex;
    extracting said adjusted second spectral component from said encoded signal complex;
    retrieving said second data item in accordance with said adjusted second reference amplitude of said adjusted second spectral component of said encoded signal complex;
    extracting said adjusted third spectral component from said encoded signal complex;
    retrieving said third data item in accordance with said adjusted first reference phase offset of said adjusted third spectral component of said encoded signal complex;
    extracting said adjusted fourth spectral component from said encoded signal complex; and
    retrieving said fourth data item in accordance with said adjusted second reference phase offset of said adjusted fourth spectral component of said encoded signal complex.

15. An apparatus for encoding information represented by at least first and second data items, said apparatus including:
    a spectrum generator adapted to generate a reference signal complex, said reference signal complex including at least first and second spectral components having first and second frequencies, respectively, said first and second frequencies being different, said first and second spectral components having first and second reference amplitudes, respectively;

a first modulator coupled to said spectrum generator for receiving said reference signal complex, said first modulator adapted to adjust said first reference amplitude of said first spectral component of said reference signal complex in accordance with said first data item; and a second modulator coupled to said spectrum generator for receiving said reference signal complex, said second modulator adapted to adjust said second reference amplitude of said second spectral component of said reference signal complex in accordance with said second data item.

16. An apparatus as defined in claim 15, wherein said first modulator includes:

a first latch adapted to store a digital representation of said first data item;

a first D/A converter coupled to said first latch adapted to convert said digital representation of said first data item to an analog representation; and a first amplifier coupled to said first D/A converter and to a first oscillator that generates a first sinusoidal signal having said first frequency, said first amplifier being adapted to adjust an energy level said first sinusoidal signal in accordance with said analog representation of said first data item.

17. An apparatus as defined in claim 15, further comprising:

a first demodulator adapted to receive said adjusted reference signal complex and to retrieve said first data item in accordance with adjusted first reference amplitude of said adjusted first spectral component; and a second demodulator adapted to receive said adjusted reference signal complex and to retrieve said second data item in accordance with adjusted second reference amplitude of said adjusted second spectral component.

18. An apparatus as defined in claim 17, wherein said first demodulator includes:

a first bandpass filter adapted to extract a first sinusoidal signal having a first energy level and said first frequency from said received adjusted reference signal complex;

a first rectifier coupled to said first bandpass filter that detects said first energy level and generates an analog representation of said adjusted first reference amplitude in accordance with said energy level and said first reference amplitude; and an A/D converter coupled to said first rectifier that converts said analog representation of said adjusted first reference amplitude to a digital representation, said digital representation corresponding to said data item.

19. An apparatus as defined in claim 15, further comprising:

a first sampler that generates a time domain representation of said reference signal complex;

a first FFT coupled to said first sampler and said first and second modulators that generates a frequency domain representation of said reference signal complex from said time domain representation, said first and second modulators being operative on said frequency domain representation to produce a frequency domain representation of an encoded signal complex including at least said adjusted first spectral component having said adjusted first amplitude and said adjusted second spectral component having said adjusted second amplitude; and a first IFFT adapted to receive said frequency domain representation of said encoded signal complex and to generate a time domain representation of said encoded signal complex.

20. An apparatus as defined in claim 19, wherein said first sampler oversamples said reference signal complex by a factor of L, said apparatus further comprising:

a decimator that decimates said time domain representation of said encoded signal complex up to said factor of L.

* * * * *